(12) United States Patent
Lee et al.

(10) Patent No.: US 12,456,660 B2
(45) Date of Patent: Oct. 28, 2025

(54) SEMICONDUCTOR PACKAGE

(71) Applicant: Samsung Electronics Co., Ltd., Suwon-si (KR)

(72) Inventors: Yongkwan Lee, Hwaseong-si (KR); Seunghwan Kim, Asan-si (KR); Jungjoo Kim, Hwaseong-si (KR); Jongwan Kim, Asan-si (KR); Junwoo Park, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 557 days.

(21) Appl. No.: 17/747,131

(22) Filed: May 18, 2022

(65) Prior Publication Data
US 2023/0082412 A1 Mar. 16, 2023

(30) Foreign Application Priority Data
Sep. 10, 2021 (KR) .......................... 10-2021-0121172

(51) Int. Cl.
*H01L 23/367* (2006.01)
*H01L 23/48* (2006.01)
(Continued)

(52) U.S. Cl.
CPC ...... *H01L 23/3677* (2013.01); *H01L 23/3675* (2013.01); *H01L 23/481* (2013.01); *H01L 23/49822* (2013.01); *H01L 23/49838* (2013.01); *H01L 25/0655* (2013.01); *H01L 25/162* (2013.01); *H01L 25/165* (2013.01); *H01L 23/49816* (2013.01); *H01L 23/49833*

(2013.01); *H01L 24/16* (2013.01); *H01L 24/32* (2013.01); *H01L 24/73* (2013.01); (Continued)

(58) Field of Classification Search
CPC ....... H01L 2924/00; H01L 2924/15311; H01L 2224/16225; H01L 2924/00014; H01L 2224/32225
See application file for complete search history.

(56) References Cited

U.S. PATENT DOCUMENTS 8,796,835 B2 8/2014 Kim et al.
8,972,759 B2 3/2015 Doshi et al.
(Continued)

FOREIGN PATENT DOCUMENTS

KR 100526248 B1 11/2005
KR 1020150091886 A 8/2015
(Continued)

*Primary Examiner* — Tony Tran
(74) *Attorney, Agent, or Firm* — Muir Patent Law, PLLC

(57) ABSTRACT

A semiconductor package is provided. The semiconductor package includes a package substrate, an interposer including a lower protective layer, conductive connectors connecting the package substrate to the interposer, a semiconductor chip arranged between the package substrate and the interposer, and cooling patches arranged between the semiconductor chip and the interposer and having cylindrical shapes, wherein each of the cooling patches includes the same material as each of the conductive connectors, a height of each of the cooling patches is less than or equal to a diameter of each of the cooling patches, and thermal conductivity of each of the cooling patches is greater than thermal conductivity of the lower protective layer.

17 Claims, 16 Drawing Sheets

(51) Int. Cl.
  *H01L 23/498*   (2006.01)
  *H01L 25/065*   (2023.01)
  *H01L 25/16*    (2023.01)
  *H01L 23/00*    (2006.01)

(52) U.S. Cl.
  CPC ............ *H01L 2224/16227* (2013.01); *H01L 2224/16237* (2013.01); *H01L 2224/16238* (2013.01); *H01L 2224/32225* (2013.01); *H01L 2224/73204* (2013.01); *H01L 2924/1431* (2013.01); *H01L 2924/1434* (2013.01)

(56) References Cited

U.S. PATENT DOCUMENTS

| | | | |
|---|---|---|---|
| 9,037,882 B2 | 5/2015 | Vadakkanmaruveedu et al. | |
| 9,111,896 B2 | 8/2015 | Yu et al. | |
| 9,594,113 B2 | 3/2017 | Davis et al. | |
| 9,746,889 B2 | 8/2017 | Mittal et al. | |
| 10,475,749 B2 | 11/2019 | Kim | |
| 10,546,844 B2 | 1/2020 | Kim et al. | |
| 10,825,774 B2 | 11/2020 | Oh et al. | |
| 10,930,596 B2 | 2/2021 | Guzek | |
| 2015/0221625 A1 | 8/2015 | Chun et al. | |
| 2015/0333239 A1* | 11/2015 | Tischler | H01L 33/642 257/99 |
| 2020/0051899 A1 | 2/2020 | Mallik et al. | |

FOREIGN PATENT DOCUMENTS

| | | | |
|---|---|---|---|
| KR | 101566152 B1 | 11/2015 | |
| KR | 101652831 B1 | 8/2016 | |
| KR | 1020160142835 A | 12/2016 | |
| KR | 200483867 Y1 | 7/2017 | |
| KR | 101813435 B1 | 12/2017 | |
| KR | 101814264 B1 | 1/2018 | |
| KR | 1020180005179 A | 1/2018 | |
| KR | 101827666 B1 | 2/2018 | |
| KR | 101870444 B1 | 7/2018 | |
| KR | 1020190050781 A | 5/2019 | |
| KR | 102161329 B1 | 9/2020 | |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2021-0121172, filed on Sep. 10, 2021, in the Korean Intellectual Property Office, the disclosure of which is incorporated by reference herein in its entirety.

BACKGROUND

The inventive concept relates to a semiconductor package, and more particularly, to a semiconductor package including semiconductor chips.

For the past few decades, the discovery of technologies, materials, and manufacturing procedures has led to the rapid development of computing power and wireless communication technology. Accordingly, high integration of high-performance transistors is enabled, and the integration speed has doubled every 18 months according to Moore's law. Semiconductor manufacturers have continuously pursued weight and size reduction and power efficiency of a system, and at this point in time when economic and physical limitations appear to be reached, system packaging, in which a system is embodied in a package, is suggested as an effective solution.

Examples of system packaging technology include integration of a logic circuit and a memory circuit, sensor packaging, heterogeneous integration of Micro Electro Mechanical Systems (MEMS) and a complementary metal-oxide semiconductor (CMOS) logic circuit. System packaging enables the reduction in form factors as well as high reliability, low power consumption, and low manufacturing costs. Because of recent high integration, research has been conducted into a method of effectively cooling a great amount of heat generated by a semiconductor package.

SUMMARY

Technical goals to be solved by the inventive concept are to provide a semiconductor package having improved reliability.

The inventive concept provides a semiconductor package. The semiconductor package includes a package substrate, an interposer arranged on the package substrate and including a lower protective layer that includes a plurality of lower pads and a plurality of openings exposing the plurality of lower pads, a plurality of conductive connectors connecting the package substrate to the interposer, a semiconductor chip arranged between the package substrate and the interposer, a plurality of cooling patches arranged between the semiconductor chip and the interposer and having cylindrical shapes; and an insulation filler covering the plurality of conductive connectors, the semiconductor chip, and the plurality of cooling patches, wherein a height of each of the plurality of cooling patches is less than or equal to a diameter of each of the plurality of cooling patches, and wherein thermal conductivity of each of the plurality of cooling patches is greater than thermal conductivity of the lower protective layer.

According to example embodiments, a semiconductor package is provided. The semiconductor package includes a package substrate, an interposer arranged on the package substrate and including a base insulating layer and a plurality of Through Silicon Vias (TSVs) penetrating the base insulating layer, a plurality of conductive connectors connecting the package substrate to the interposer, a semiconductor chip arranged between the package substrate and the interposer; and a plurality of cooling patches arranged between the semiconductor chip and the interposer and having cylindrical shapes, wherein a height of each of the plurality of cooling patches is less than or equal to a diameter of each of the plurality of cooling patches, and wherein thermal conductivity of each of the plurality of cooling patches ranges from 10 W/(m·K) to 100 W/(m·K).

According to example embodiments, a semiconductor package is provided. The semiconductor package includes a redistribution layer including: an insulating layer; a plurality of redistribution patterns extending in a horizontal direction; a plurality of upper redistribution pads that are apart from the plurality of redistribution patterns with the insulating layer therebetween; and a plurality of redistribution vias connecting the plurality of redistribution patterns to the plurality of redistribution pads, a semiconductor chip arranged on the redistribution layer, an interposer that is spaced apart from the redistribution layer with the semiconductor chip therebetween, a plurality of cooling patches respectively contacting the semiconductor chip and the interposer; and an insulation filler covering the semiconductor chip and the plurality of cooling patches, wherein the plurality of cooling patches each include a solder material and each have a coin shape.

According to example embodiments, a manufacturing method of a semiconductor package is provided. The manufacturing method includes providing a plurality of first conductive connectors to a package substrate on which a semiconductor chip is mounted, and providing a plurality of second conductive connectors and a plurality of cooling solders to an interposer, forming a plurality of cooling patches by molding the plurality of cooling solders, coupling the interposer to the package substrate by coupling the plurality of first and second conductive connectors, performing a flux cleaning process on a space between the interposer and the package substrate, and providing an insulation filler covering the semiconductor chip, the plurality of first and second conductive connectors, and the plurality of cooling patches, wherein thermal conductivity of each of the plurality of cooling patches ranges from 10 W/(m·K) to 100 W/(m·K), and wherein the plurality of cooling patches have coin shapes.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
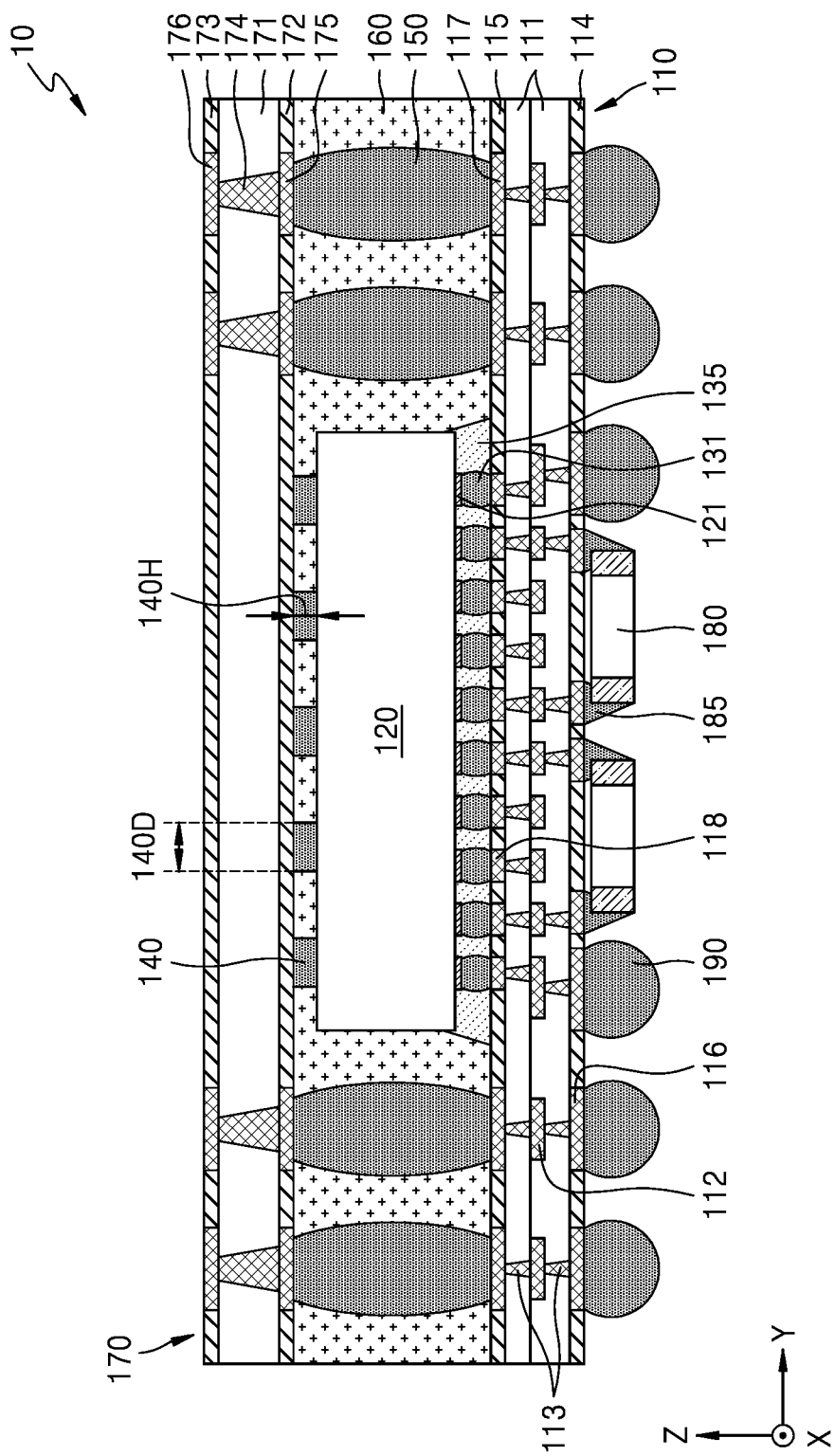
FIG. 1A is a cross-sectional view of a semiconductor package, according to example embodiments.

Hereinafter, one or more embodiments of the inventive concept will be described in detail with reference to the attached drawings. Like reference numerals in the drawings denote like elements, and repeated descriptions thereof will be omitted.

FIG. 1A is a cross-sectional view of a semiconductor package 10 according to example embodiments.

Figure 1B:
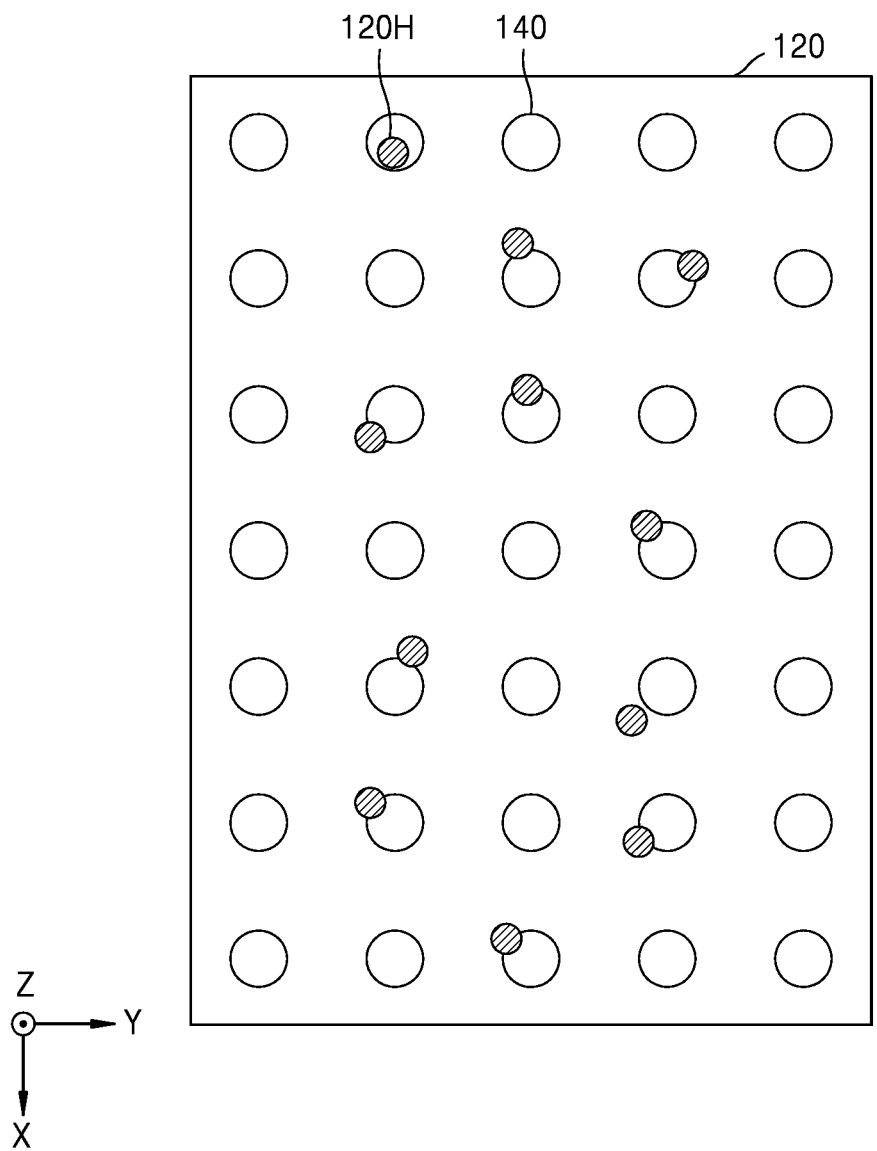
FIG. 1B is a plan view illustrating an arrangement of cooling patches.

FIG. 1B is a plan view illustrating an arrangement of cooling patches 140 in a semiconductor package 10. In FIG. 1B, components other than a semiconductor chip 120 and the cooling patches 140 are omitted for convenience.

Referring to FIGS. 1A and 1B, the semiconductor package 10 may include a package substrate 110, the semiconductor chip 120, the cooling patches 140, conductive connectors 150, an insulation filler 160, an interposer 170, passive elements 180, and external connection terminals 190.

Here, two directions parallel to an upper surface of the package substrate 110 and perpendicular to each other are defined as an X direction and a Y direction, and a direction perpendicular to the upper surface of the package substrate 110 is defined as a Z direction. Unless otherwise stated, the definition regarding the directions is the same in the drawings below.

The package substrate 110 may be, for example, a Printed Circuit Board (PCB). The package substrate 110 may include a substrate base 111 including at least one material selected from phenol resin, epoxy resin, and polyimide (PI). Also, the package substrate 110 may include lower pads 116 arranged on a lower surface of the substrate base 111, and first and second upper pads 117 and 118 arranged on an upper surface of the substrate base 111. The substrate base 111 may include conductive patterns 112 and conductive vias 113 configured to be electrically connected to at least any one of the first and second upper pads 117 and 118 and the lower pads 116.

The conductive patterns 112 may extend in a horizontal direction (e.g., the X direction and/or the Y direction) in the package substrate 110, and the conductive vias 113 may extend in a vertical direction (e.g., the Z direction) in the package substrate 110. Each of the conductive vias 113 may be tapered from a lower protective layer 114 to an upper protective layer 115, gradually narrowing in a direction from the lower protective layer 114 to the upper protective layer 115. For example, a width of each of the conductive vias 113 may be greater near the lower protective layer 114 and smaller near the upper protective layer 115.

The upper protective layer 115 may be formed on the upper surface of the substrate base 111, and the lower protective layer 114 may be formed on the lower surface of the substrate base 111. Lower openings exposing the lower pads 116 may be formed in the lower protective layer 114, and openings exposing the first and second upper pads 117 and 118 may be formed in the upper protective layer 115. In some embodiments, lower surfaces of the lower pads 116 and the lower protective layer 114 may be coplanar with one another, and upper surfaces of the first and second upper pads 117 and 118 and the upper protective layer 115 may be coplanar with one another. The upper protective layer 115 and the lower protective layer 114 may include, for example, solder resist.

The conductive patterns 112, the conductive vias 113, the lower pads 116, and the first and second upper pads 117 and 118 may each include, for example, metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof, but the materials are not limited thereto.

The conductive connectors 150 may be respectively attached to the first upper pads 117, and chip connection bumps 131 may be respectively attached to the second upper pads 118. For example, the conductive connectors 150 may contact upper surfaces of the first upper pads 117, and the chip connection bumps 131 may contact lower surfaces of the second upper pads 118. As used herein, the term "contact" refers to a direct connection (i.e., touching) unless the context indicates otherwise. Each chip connection bump 131 may be a microbump.

The external connection terminals 190 may be respectively attached to the lower pads 116. The external connection terminals 190 may be respectively connected to the lower pads 116 through the lower openings formed in the lower protective layer 114. The external connection terminals 190 may each be, for example, a solder ball. The external connection terminals 190 may provide an electrical connection between the semiconductor package 10 and an external device.

The semiconductor chip 120 may be mounted on the package substrate 110. The semiconductor chip 120 may be between the package substrate 110 and the interposer 170. The semiconductor chip 120 may include a semiconductor substrate having an active surface and a non-active surface that are opposite to each other and may include a semiconductor device layer formed on the active surface of the semiconductor substrate. The semiconductor chip 120 may include a lower surface and an upper surface that are opposite to each other. The semiconductor chip 120 may include chip pads 121 arranged on the lower surface of the semiconductor chip 120.

The semiconductor package 10 may be a fan-out semiconductor package. For example, a horizontal width and a horizontal area of the semiconductor chip 120 may be less than a horizontal width and a horizontal area of the package substrate 110.

The lower surface of the semiconductor chip 120 may be adjacent to the active surface of the semiconductor substrate, and the upper surface of the semiconductor chip 120 may be adjacent to the non-active surface of the semiconductor substrate. The chip pads 121 of the semiconductor chip 120 may be electrically connected to the semiconductor device layer by a wire structure (not illustrated) inside the semiconductor chip 120.

As a non-limited example, the semiconductor chip 120 may be a logic chip. For example, the semiconductor chip 120 may include any one of a deep learning model, a microprocessor, a graphics processor, a signal processor, a network processor, a chipset, an audio codec, a video codec, and an application processor (AP).

As another example, the semiconductor chip 120 may include a volatile memory chip and/or a non-volatile memory chip. The volatile memory chip may include, for example, Dynamic Random Access Memory (DRAM), static RAM (SRAM), thyristor RAM (TRAM), zero capacitor RAM (ZRAM), or Twin Transistor RAM (TTRAM). Also, the non-volatile memory chip may include, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or an insulator resistance change memory.

The semiconductor chip 120 may be mounted on the package substrate 110 in a face-down manner or a flip-chip manner. For example, the lower surface of the semiconductor chip 120, on which the chip pads 121 are formed, may face the package substrate 110. The chip pads 121 of the semiconductor chip 120 may be electrically and respectively connected to the second upper pads 118 through the chip connection bumps 131. The chip pads 121 may be used as terminals for transmitting input/output data signals of the semiconductor chip 120 or terminals for power and/or ground connection of the semiconductor chip 120.

An underfill material layer 135 covering the chip connection bumps 131 may be arranged between the semiconductor chip 120 and the package substrate 110. For example, the underfill material layer 135 may include epoxy resin formed through a capillary underfill process. As another example, the underfill material layer 135 may be a non-conductive film. As another example, the insulation filler 160 may directly fill a gap between the semiconductor chip 120 and the package substrate 110 according to a molded underfill method, and in this case, the underfill material layer 135 may be omitted.

The interposer 170 may be arranged on the package substrate 110 and the semiconductor chip 120. The interposer 170 may include a base insulating layer 171, a lower protective layer 172, an upper protective layer 173, conductive vias 174, lower pads 175, and upper pads 176.

The base insulating layer 171 may include at least one material selected from phenol resin, epoxy resin, and PI. For example, the base insulating layer 171 may include at least one material selected from PI, Flame Retardant 4 (FR-4), tetra-functional epoxy, polyphenylene ether, epoxy/polyphenylene oxide, Bismaleimide triazine (BT), thermount, cyanate ester, and a liquid crystal polymer.

The upper pads 176 may be arranged on an upper surface of the base insulating layer 171. The lower pads 175 may be arranged on a lower surface of the base insulating layer 171. The conductive vias 174 may penetrate the base insulating layer 171. On the upper pads 176, external connection terminals such as solders and bumps may be provided. The upper pads 176 may provide a connection to a semiconductor chip or a semiconductor package mounted on the interposer 170.

The lower pads 175 may respectively contact the conductive connectors 150. Each lower pad 175 may be connected to any corresponding one of the first upper pads 117 through the conductive connector 150. Accordingly, an electrical connection may be formed between the package substrate 110 and the interposer 170.

The conductive vias 174 may respectively contact the upper pads 176 and the lower pads 175. Each lower pad 175 may be electrically connected to any corresponding one of the upper pads 176 through the conductive via 174. The conductive vias 174 may gradually narrow in a direction from the lower pads 175 to the upper protective layer 173. For example, the conductive vias 174 may taper as they extend away from the lower pads 175.

The conductive vias 174, the lower pads 175, and the upper pads 176 may include any one of the aforementioned materials in relation to the conductive patterns 112, the conductive vias 113, the lower pads 116, and the first and second upper pads 117 and 118.

The upper protective layer 173 may be arranged on the upper surface of the base insulating layer 171, and the lower protective layer 172 may be arranged on the lower surface of the base insulating layer 171. The upper protective layer 173 may cover the upper surface of the base insulating layer 171. The upper protective layer 173 may include upper openings through which the upper pads 176 are exposed. The lower protective layer 172 may cover the lower surface of the base insulating layer 171. The lower protective layer 172 may include lower openings through which the lower pads 175 are exposed. The upper protective layer 173 and the lower protective layer 172 may include, for example, solder resist.

The conductive connectors 150 may have pillar shapes extending between the lower pads 175 of the interposer 170 and the first upper pads 117 of the package substrate 110 in the Z direction. Lower portions of the conductive connectors 150 may respectively contact the first upper pads 117 of the package substrate 110. Upper portions of the conductive connectors 150 may respectively contact the lower pads 175 of the interposer 170. According to example embodiments, the conductive connectors 150 may include conductive materials. According to example embodiments, each of the conductive connectors 150 may include a solder material. According to example embodiments, each of the conductive connectors 150 may include Cu, Sn, lead (Pb), or the like. According to example embodiments, each of the conductive connectors 150 may include an alloy material including at least some of Cu, Sn, and Pb.

The cooling patches 140 may be arranged between the semiconductor chip 120 and the interposer 170. The cooling patches 140 may respectively contact a lower surface of the lower protective layer 172 of the interposer 170 and the upper surface of the semiconductor chip 120.

According to example embodiments, the semiconductor chip 120 may include hot spots 120H with high heating values because of computing power and workload that are locally high in portions of an integrated circuit. For example, the hot spots 120H may be local maximum points of a temperature of the semiconductor chip 120 while the semiconductor chip 120 is driven.

According to example embodiments, the cooling patches 140 may be arranged to form rows and columns on the semiconductor chip 120. According to example embodiments, the cooling patches 140 may be horizontally apart from each other.

According to example embodiments, some of the cooling patches 140 may be adjacent to the hot spots 120H. According to example embodiments, some of the cooling patches 140 may overlap the hot spots 120H in the Z direction. According to example embodiments, some of the cooling patches 140 may contact the hot spots 120H. However, one or more embodiments are not limited thereto, and the cooling patches 140 may be arbitrarily arranged to effectively cool the semiconductor chip 120.

According to example embodiments, each cooling patch 140 may have a coin shape. For example, each cooling patch 140 may have a cylindrical shape that has a relatively small aspect ratio. Here, the aspect ratio may be a ratio of a height 140H of the cooling patch 140 to a diameter 140D thereof. The aspect ratio of each cooling patch 140 may be less than or equal to about 1. The aspect ratio of each cooling patch 140 may be equal to or greater than about 1/20. A side profile of the cooling patch 140 on a cross-sectional view may be linear.

According to example embodiments, the height 140H of each cooling patch 140 may be less than or equal to the diameter 140D of each cooling patch 140. According to example embodiments, the height 140H of each cooling patch 140 may range from about 10 μm to about 100 μm. According to example embodiments, the diameter 140D of each cooling patch 140 may range from about 50 μm to about 200 μm.

According to example embodiments, each cooling patch 140 may include the same material as the conductive connector 150. According to example embodiments, each cooling patch 140 may include a solder material. According to example embodiments, each cooling patch 140 may include Cu, Sn, Pb, or the like. According to example embodiments, each cooling patch 140 may include an alloy material including at least some of Cu, Sn, and Pb.

According to example embodiments, each cooling patch 140 may include a material having high thermal conductivity. According to example embodiments, the thermal conductivity of each cooling patch 140 may range from about 10 W/(m·K) to about 100 W/(m·K). The thermal conductivity of each cooling patch 140 may range from about 20 W/(m·K) to about 80 W/(m·K). According to example embodiments, the thermal conductivity of each cooling patch 140 may be greater than that of the lower protective layer 172.

According to example embodiments, the cooling patches 140 having high thermal conductivity may be adjacent to the hot spots 120H of the semiconductor chip 120. Accordingly, the cooling efficiency and reliability of the semiconductor package 10 may be improved.

According to example embodiments, the cooling patches 140 may maintain gaps between the semiconductor chip 120 and the interposer 170. The semiconductor package 10 may secure a space sufficient enough for flux cleaning because of the cooling patches 140, wherein the space is between the semiconductor chip 120 and the interposer 170. Accordingly, the detachment of the lower protective layer 172 from the base insulating layer 171 caused by insufficient flux cleaning may be prevented.

Also, when heat and pressure are applied to the semiconductor package 10 during the manufacturing processes, the cooling patches 140 may prevent the deformation of the conductive connectors 150 including solders, etc. Accordingly, the uniformity of the height of the semiconductor package 10 in the Z direction may be improved, and the bending of the semiconductor package 10 may be prevented.

The passive elements 180 may be arranged on the lower surface of the package substrate 110. The passive elements 180 may each be a surface-mount device (SMD). For example, at least one passive element 180 may include a capacitor element, for example, a silicon capacitor, a Low Inductance Ceramic Capacitor (LICC), and a Multi-Layered Ceramic Capacitor (MLCC) and a resistive element. The passive elements 180 may be electrically connected to the lower pads 116 through connection terminals 185, respectively. Each passive element 180 may be fixed to the lower pad 116 through the connection terminal 185.

The insulation filler 160 may be provided on the package substrate 110. The insulation filler 160 may protect the package substrate 110, the semiconductor chip 120, the cooling patches 140, the conductive connectors 150, and the interposer 170 from an external environment. The insulation filler 160 may cover at least some portions of each of the package substrate 110, the semiconductor chip 120, the cooling patches 140, the conductive connectors 150, and the interposer 170. For example, the insulation filler 160 may cover the upper surface of the package substrate 110, side and upper surfaces of the semiconductor chip 120, side surfaces of the cooling patches 140, side surfaces of the conductive connectors 150, and a lower surface of the interposer 170. In some embodiments, an upper surface of the insulation filler 160 may be coplanar with upper surfaces of the cooling patches 140 and the conductive connectors 150, and a lower surface of the insulation filler 160 may be coplanar with lower surfaces of the chip connection bumps 131, the underfill material layer 135, and the conductive connectors 150.

According to example embodiments, the insulation filler 160 may fill gaps between the cooling patches 140. According to example embodiments, the insulation filler 160 may horizontally surround each cooling patch 140.

According to example embodiments, the insulation filler 160 may include epoxy-group molding resin, polyimide-group molding resin, or the like. For example, the insulation filler 160 may include an Epoxy Molding Compound (EMC).

Figure 2A:
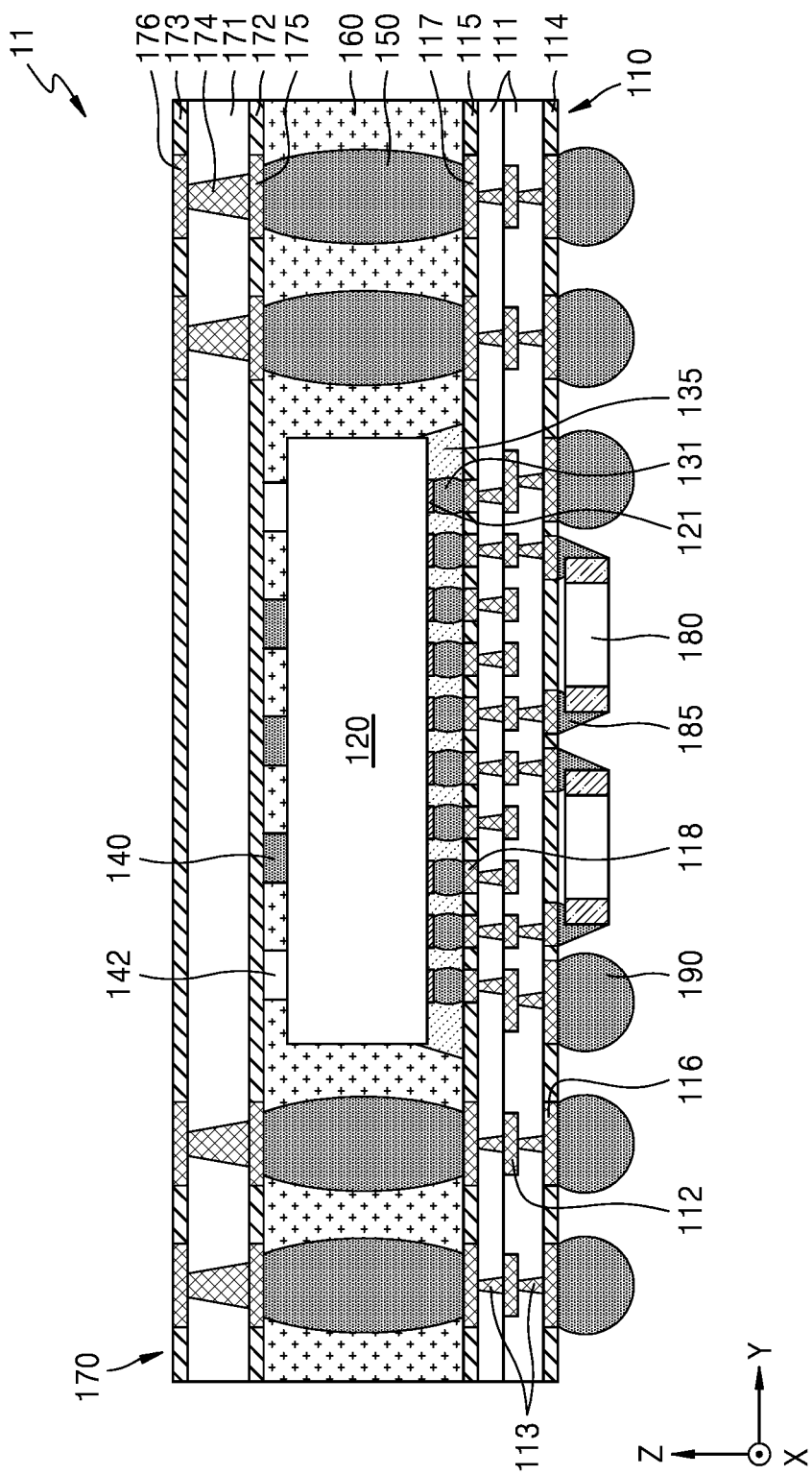
FIG. 2A is a cross-sectional view of a semiconductor package, according to example embodiments.

FIG. 2A is a cross-sectional view of a semiconductor package 11 according to example embodiments.

Figure 2B:
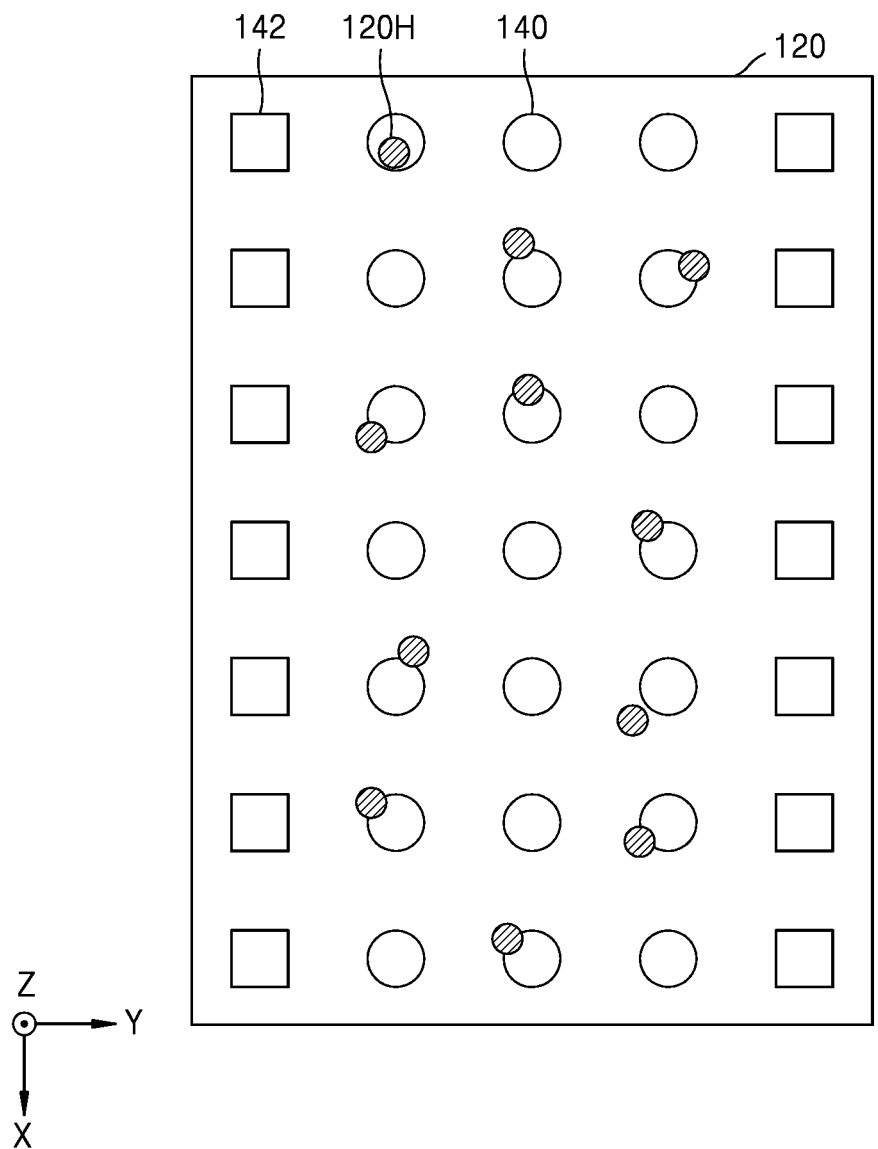
FIG. 2B is a plan view illustrating arrangements of cooling patches and insulating patches.

FIG. 2B is a plan view illustrating arrangements of the cooling patches 140 and insulating patches 142. In FIG. 2B, components other than the semiconductor chip 120, the cooling patches 140, and the insulating patches 142 are omitted for convenience of explanation.

Referring to FIGS. 2A and 2B, the semiconductor package 11 may include the package substrate 110, the semiconductor chip 120, the cooling patches 140, the insulating patches 142, the conductive connectors 150, the insulation filler 160, the interposer 170, the passive elements 180, and the external connection terminals 190.

The package substrate 110, the semiconductor chip 120, the conductive connectors 150, the insulation filler 160, the interposer 170, the passive elements 180, and the external connection terminals 190 are substantially the same as those described with reference to FIGS. 1A and 1B, and thus, repeated descriptions thereof are not provided.

According to example embodiments, the cooling patches 140 and the insulating patches 142 may be arranged between the semiconductor chip 120 and the interposer 170. According to example embodiments, the cooling patches 140 and the insulating patches 142 may respectively contact the lower surface of the lower protective layer 172 of the interposer 170 and the upper surface of the semiconductor chip 120. The height of each cooling patch 140 may be substantially the same as the height of each insulating patch 142.

According to example embodiments, the cooling patches 140 and the insulating patches 142 may be arranged to form rows and columns on the semiconductor chip 120. According to example embodiments, the cooling patches 140 may be horizontally apart from the insulating patches 142.

According to example embodiments, the insulating patches 142 may be spaced apart from the hot spots 120H in a horizontal direction. According to example embodiments, a distance between each hot spot 120H and the closest one of the insulating patches 142 may be greater than a distance between each hot spot 120H and the closest one of the cooling patches 140. According to example embodiments, the insulating patches 142 may not overlap the hot spots 120H in the Z direction.

Each cooling patch 140 may have thermal conductivity that is higher than that of the insulating patch 142. The thermal conductivity of each cooling patch 140 may range from about 20 times to about 100 times the thermal conductivity of the insulating patch 142. The thermal conductivity of each insulating patch 142 may be less than or equal to about 1 W/(m·K). The thermal conductivity of each insulating patch 142 may be about 0.3 W/(m·K). Each insulating patch 142 may include solder resist.

When viewed from the top, a planar shape of each insulating patch 142 is a square. However, it is merely an example and the technical spirit of the inventive concept is not limited thereto. The planar shape of the insulating patch 142 may be, for example, a polygon such as a triangle, a pentagon, or a hexagon, a circle, or an oval.

According to example embodiments, the insulating patches 142 are arranged between the semiconductor chip 120 and the interposer 170 in addition to the cooling patches 140, and thus, the conductive connectors 150 and the cooling patches 140 may be prevented from being deformed during a thermal compression process of forming the conductive connectors 150.

The insulation filler 160 may further cover the insulating patches 142. The insulation filler 160 may fill gaps between the insulating patches 142 and gaps between the insulating patches 142 and the cooling patches 140.

Figure 3:
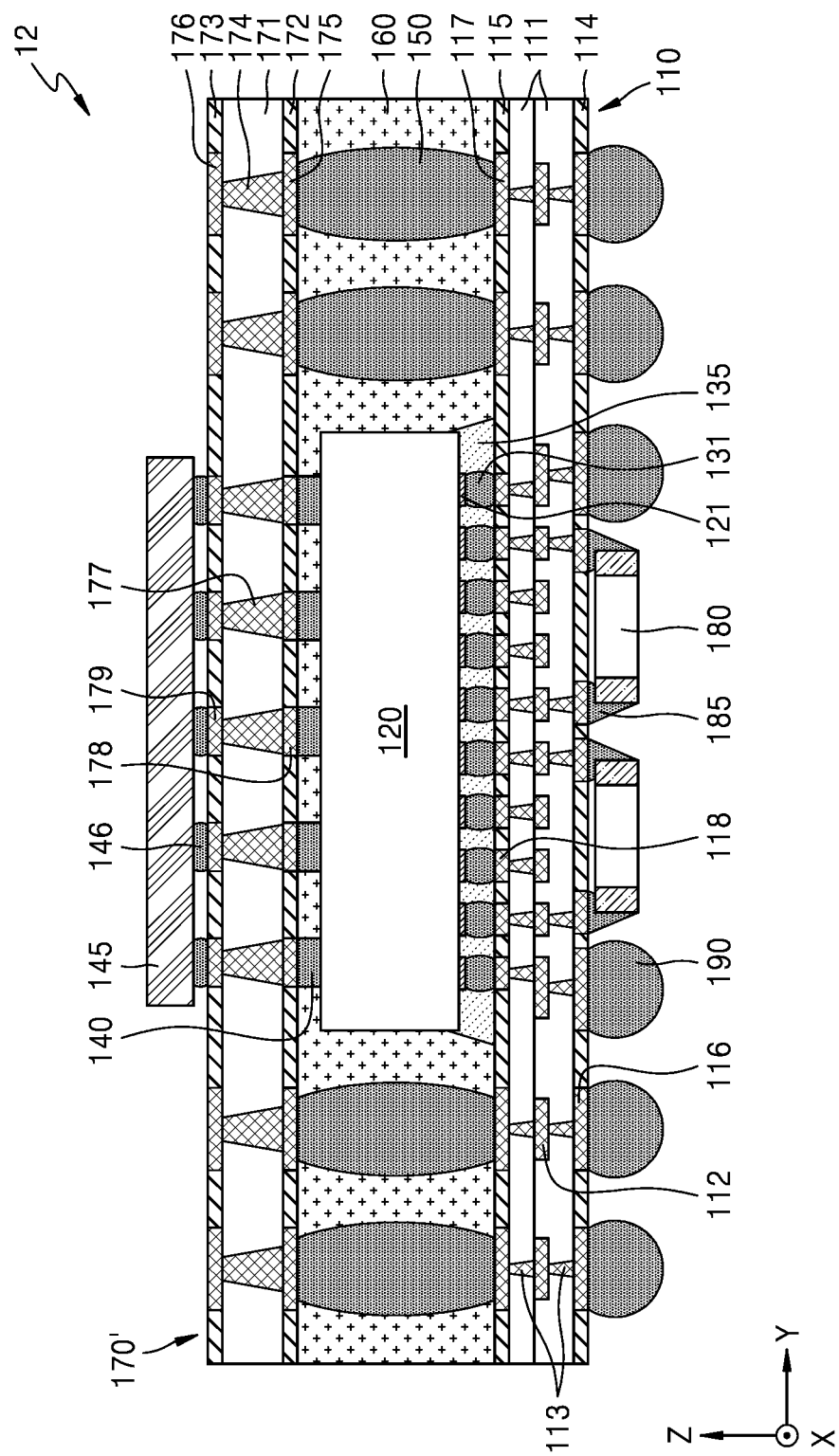
FIG. 3 is a cross-sectional view of a semiconductor package, according to other example embodiments.

FIG. 3 is a cross-sectional view of a semiconductor package 12 according to other example embodiments.

Referring to FIG. 3, the semiconductor package 12 may include the package substrate 110, the semiconductor chip 120, the cooling patches 140, a heat dissipation device 145, the conductive connectors 150, the insulation filler 160, an interposer 170', the passive elements 180, and the external connection terminals 190.

The package substrate 110, the semiconductor chip 120, the conductive connectors 150, the insulation filler 160, the passive elements 180, and the external connection terminals 190 are substantially the same as those described with reference to FIGS. 1A and 1B, and thus repeated descriptions thereof are not provided.

According to example embodiments, the interposer 170' may further include thermally conductive Through Silicon Vias (TSVs) 177, lower thermal conductive pads 178, and upper thermal conductive pads 179 in addition to the base insulating layer 171, the lower protective layer 172, the upper protective layer 173, the conductive vias 174, the lower pads 175, and the upper pads 176. The base insulating layer 171, the lower protective layer 172, the upper protective layer 173, the conductive vias 174, the lower pads 175, and the upper pads 176 are substantially the same as those described with reference to FIGS. 1A and 1B, and thus repeated descriptions thereof are not provided.

According to example embodiments, the lower thermal conductive pads 178 and the upper thermal conductive pads 179 may be electrical dummy pads. According to example embodiments, the lower thermal conductive pads 178 and the upper thermal conductive pads 179 may be insulated from an external circuit connected to any one of the package substrate 110 and the semiconductor chip 120 or the interposer 170'. According to example embodiments, the lower thermal conductive pads 178 and the upper thermal conductive pads 179 may be electrically floated.

According to example embodiments, the lower thermal conductive pads 178 may respectively contact the cooling patches 140. According to example embodiments, the upper thermal conductive pads 179 may respectively overlap the lower thermal conductive pads 178 in the Z direction. The upper thermal conductive pads 179 may be respectively connected to the lower thermal conductive pads 178 by the thermally conductive TSVs 177. For example, upper surfaces of the thermally conductive TSVs 177 may contact lower surfaces of the upper thermal conductive pads 179, and lower surfaces of the thermally conductive TSVs 177 may contact upper surfaces of the lower thermal conductive pads 178. According to example embodiments, the lower thermal conductive pads 178, the thermally conductive TSVs 177, and the upper thermal conductive pads 179 may provide heat dissipation paths to the cooling patches 140. The thermally conductive TSVs 177 may have the same shape as that of the conductive vias 174 and may be made of the same material. For example, the thermally conductive TSVs 177 may gradually narrow in a direction from the lower thermal conductive pads 178 to the upper thermal conductive pads 179.

According to example embodiments, the heat dissipation device 145 may be on the interposer 170'. The heat dissipation device 145 may be respectively connected to the upper thermal conductive pads 179 through connection terminals 146 such as bumps. According to example embodiments, the heat dissipation device 145 may include a material having high thermal conductivity. The heat dissipation device 145 may include, for example, a heat slug.

According to example embodiments, the cooling efficiency of the semiconductor package 12 may be improved by providing the heat dissipation device 145 in addition to the cooling patches 140.

Figure 4:
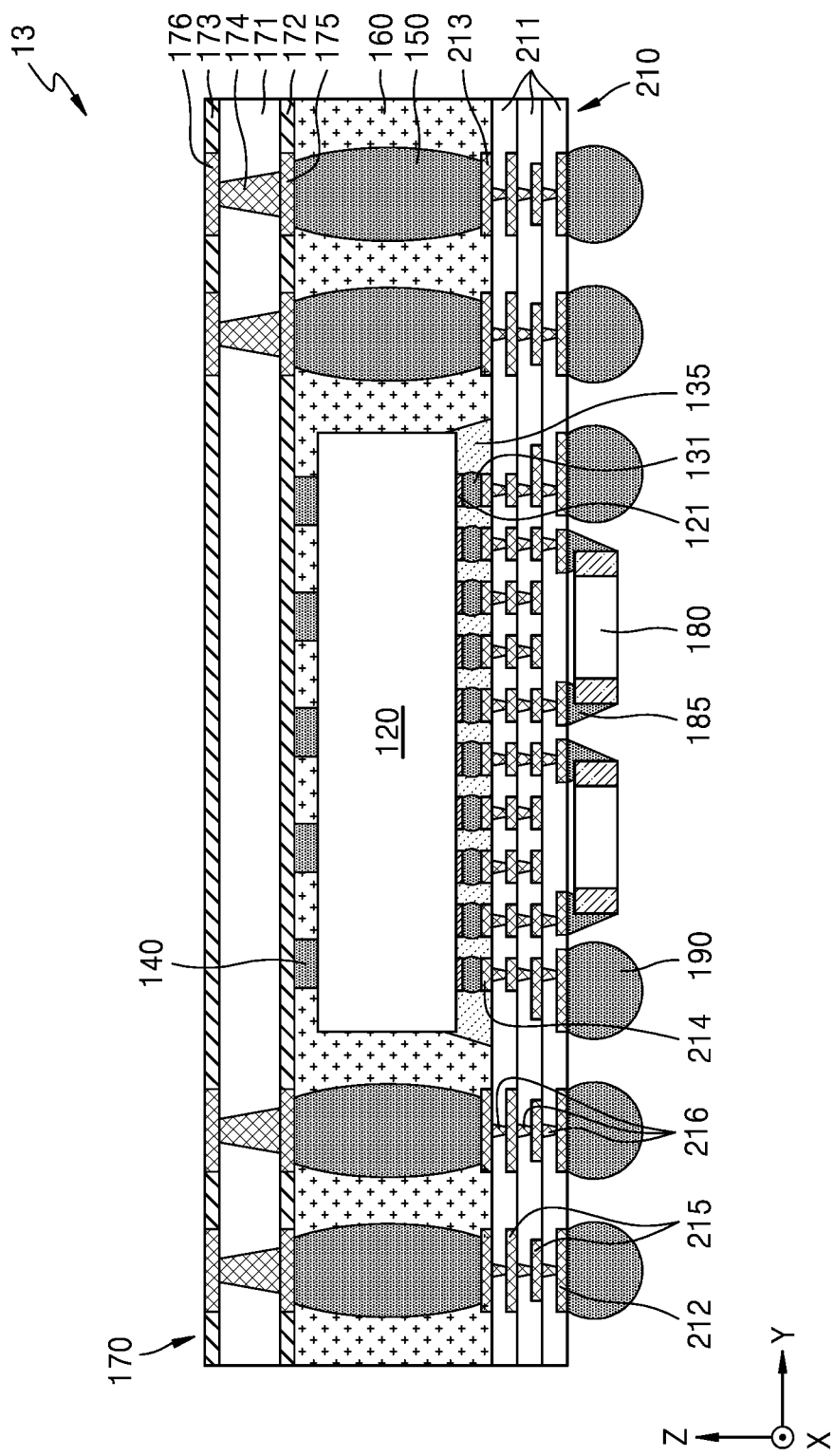
FIG. 4 is a cross-sectional view of a semiconductor package, according to other example embodiments.

FIG. 4 is a cross-sectional view of a semiconductor package 13 according to other example embodiments.

Referring to FIG. 4, the semiconductor package 13 may include a redistribution layer 210, the semiconductor chip 120, the cooling patches 140, the conductive connectors 150, the insulation filler 160, the interposer 170, the passive elements 180, and the external connection terminals 190.

The semiconductor chip 120, the conductive connectors 150, the insulation filler 160, the interposer 170, the passive elements 180, and the external connection terminals 190 are substantially the same as those described with reference to FIGS. 1A and 1B, and thus, repeated descriptions thereof are not provided.

According to example embodiments, the semiconductor package 13 may be a Chip Last Fan Out Wafer Level Semiconductor Package in which the redistribution layer 210 is formed first and then the interposer 170 and at least one semiconductor chip 120 are mounted on the redistribution layer 210.

The redistribution layer 210 may include insulating layers 211, lower redistribution pads 212, first and second upper redistribution pads 213 and 214, redistribution patterns 215, and redistribution vias 216.

The insulating layers 211 may be stacked in the Z direction. The insulating layers 211 may cover the redistribution patterns 215 and the redistribution vias 216. The insulating layers 211 may expose lower surfaces of the lower redistribution pads 212 and upper surfaces of the first and second upper redistribution pads 213 and 214.

The insulating layers 211 may each include an insulating material. The insulating layers 211 may each include, for example, a material film including an organic compound. According to example embodiments, each insulating layer 211 may include a photo imageable dielectric (PID), an Ajinomoto Build-up Film (ABF), photosensitive polyimide (PSPI), and the like.

The lower redistribution pads 212 exposed by the insulating layers 211 may be respectively connected to the external connection terminals 190. For example, the external connection terminals 190 may contact lower surfaces of the lower redistribution pads 212. The first upper redistribution pads 213 exposed by the insulating layers 211 may be respectively connected to the conductive connectors 150. For example, upper surfaces of the first upper redistribution pads 213 may contact lower surfaces of the conductive connectors 150. The second upper redistribution pads 214 exposed by the insulating layers 211 may be respectively connected to the chip connection bumps 131. For example, upper surfaces of the second upper redistribution pads 214 may contact the chip connection bumps 131.

The redistribution patterns 215 may have line shapes extending lengthwise in the horizontal directions (that is, the X and Y directions). The redistribution vias 216 may extend in the Z direction by penetrating the insulating layers 211 and may connect the redistribution patterns 215 that are at different levels to each other or may connect the lower redistribution pads 212 and the first and second upper redistribution pads 213 and 214 to adjacent redistribution patterns 215.

According to example embodiments, the redistribution vias 216 may be tapered in a downward direction (that is, a direction away from the semiconductor chip 120). For example, a horizontal width of each redistribution via 216 may decrease away from the semiconductor chip 120. However, one or more embodiments are not limited thereto. The redistribution vias 216 may be tapered in an upward direction (that is, a direction towards the semiconductor chip 120) like redistribution vias 216' of FIG. 5.

The lower redistribution pads 212, the first and second upper redistribution pads 213 and 214, the redistribution patterns 215, and the redistribution vias 216 may each include metal such as Cu, Al, W, Ti, Ta, In, Mo, Mn, Co, Sn, Ni, Mg, Re, Be, Ga, or Ru or an alloy thereof.

Seed layers may be arranged between the redistribution patterns 215 and the insulating layers 211 and between the redistribution vias 216 and the insulating layers 211. For example, the seed layer may be formed through physical vapor deposition, and the redistribution patterns 215 and the redistribution vias 216 may be formed through electroless plating based on the seed layers.

The seed layer may include, for example, Cu, Ti, TiW, titanium nitride (TiN), Ta, tantalum nitride (TaN), chromium (Cr), Al, or the like. As another example, the seed layer may have a multilayered structure such as Cu/Ti or Cu/TiW. When the redistribution patterns 215 and the redistribution vias 216 include Cu, the seed layer may prevent Cu from diffusing to the insulating layers 211.

Figure 5:
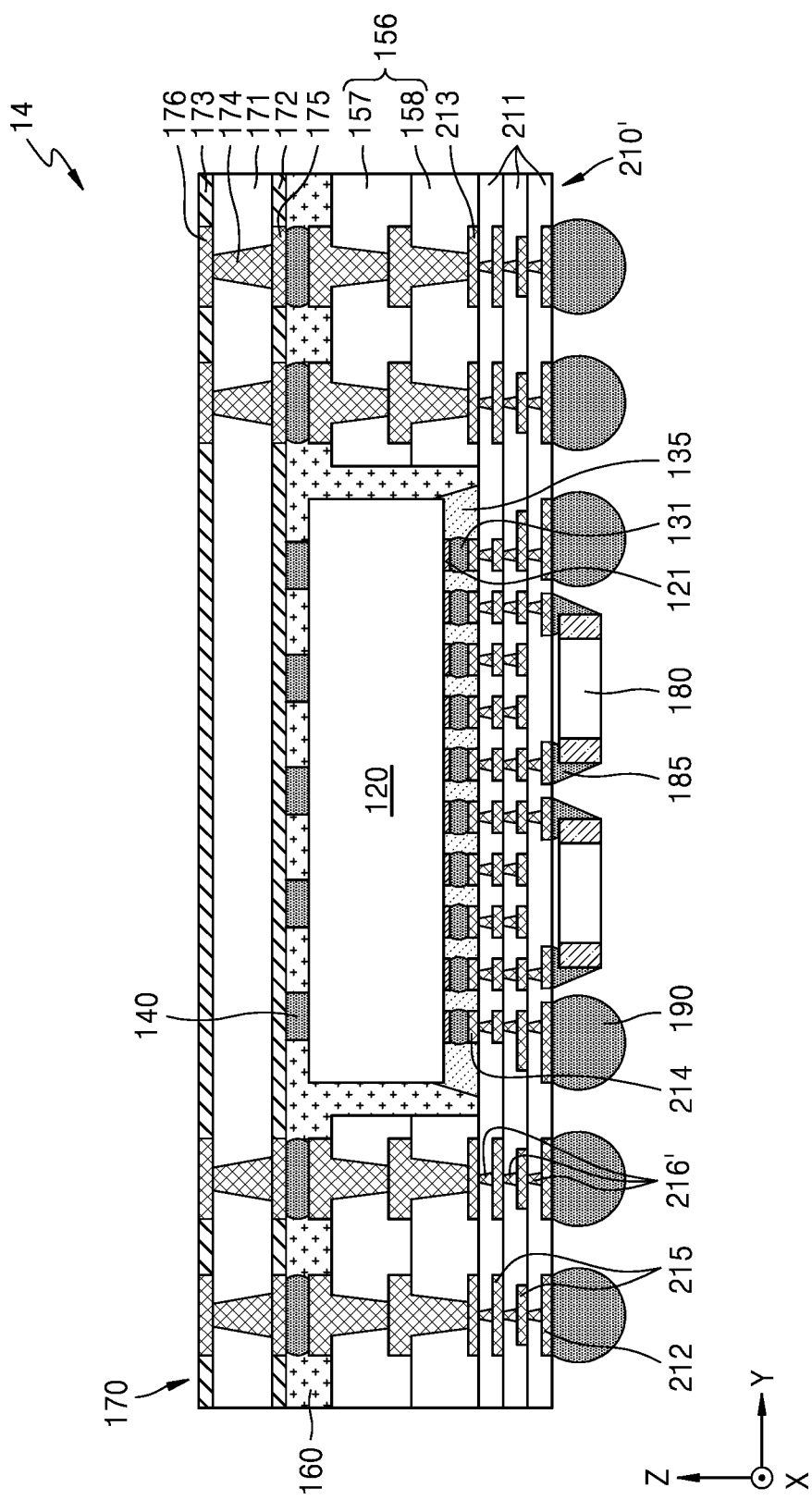
FIG. 5 is a cross-sectional view of a semiconductor package, according to other example embodiments.

FIG. 5 is a cross-sectional view of a semiconductor package 14 according to other example embodiments.

Referring to FIG. 5, the semiconductor package 14 may include a redistribution layer 210', the semiconductor chip 120, the cooling patches 140, a connection structure 156, the insulation filler 160, the interposer 170, the passive elements 180, and the external connection terminals 190.

The semiconductor chip 120, the insulation filler 160, the interposer 170, the passive elements 180, and the external connection terminals 190 are substantially the same as those described with reference to FIGS. 1A and 1B, and thus, repeated descriptions thereof are not provided.

According to example embodiments, the semiconductor package 14 may be a Fan Out Panel Level Package (FOPLP). For example, the semiconductor package 14 may be formed by forming the redistribution layer 210' on the connection structure 156 and then attaching the interposer 170 to the connection structure 156. The connection structure 156 may be a separated panel board. Accordingly, a packaging process may be simultaneously performed on a great number of semiconductor chips 120, and the productivity of the semiconductor package 14 may be improved.

The redistribution layer 210' may include the insulating layers 211, the lower redistribution pads 212, the first and second upper redistribution pads 213 and 214, the redistribution patterns 215, and the redistribution vias 216'. The redistribution layer 210' is substantially similar to the redistribution layer 210 described with reference to FIG. 4 except that the redistribution vias 216' have structures tapered in an upward direction.

The connection structure 156 may include insulating layers 157 and TSVs 158 penetrating the insulating layers 157. The insulating layers 157 may horizontally surround the semiconductor chip 120. Connection terminals 159 may be provided between the TSVs 158 and the lower pads 175. The connection terminals 159 may be provided for the electrical connection between the TSVs 158 and the lower pads 175.

As another example, the connection terminals 159 may be omitted, and the TSVs 158 may be respectively coupled to the lower pads 175 through direct bonding. Also, two insulating layers 157 and the TSVs 158 are illustrated, but the redistribution layer 210' may be connected to the interposer 170 by a single insulating layer and a single TSV.

Figure 6:
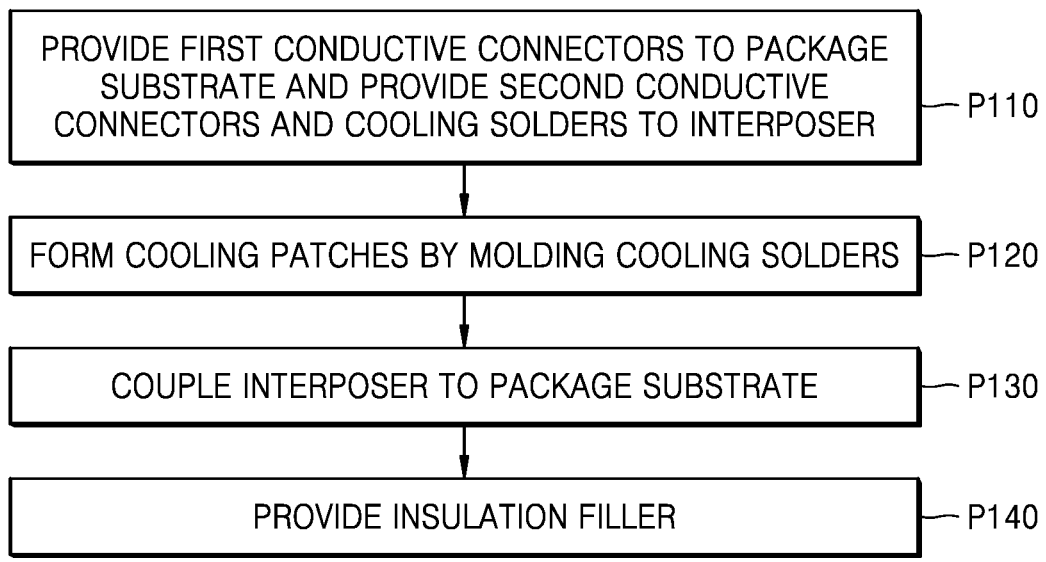
FIG. 6 is a flowchart of a manufacturing method of a semiconductor package, according to example embodiments.

FIG. 6 is a flowchart of a manufacturing method of a semiconductor package, according to example embodiments.

FIGS. 7 to 11 are cross-sectional views of a manufacturing method of a semiconductor package, according to example embodiments.

Figure 7:
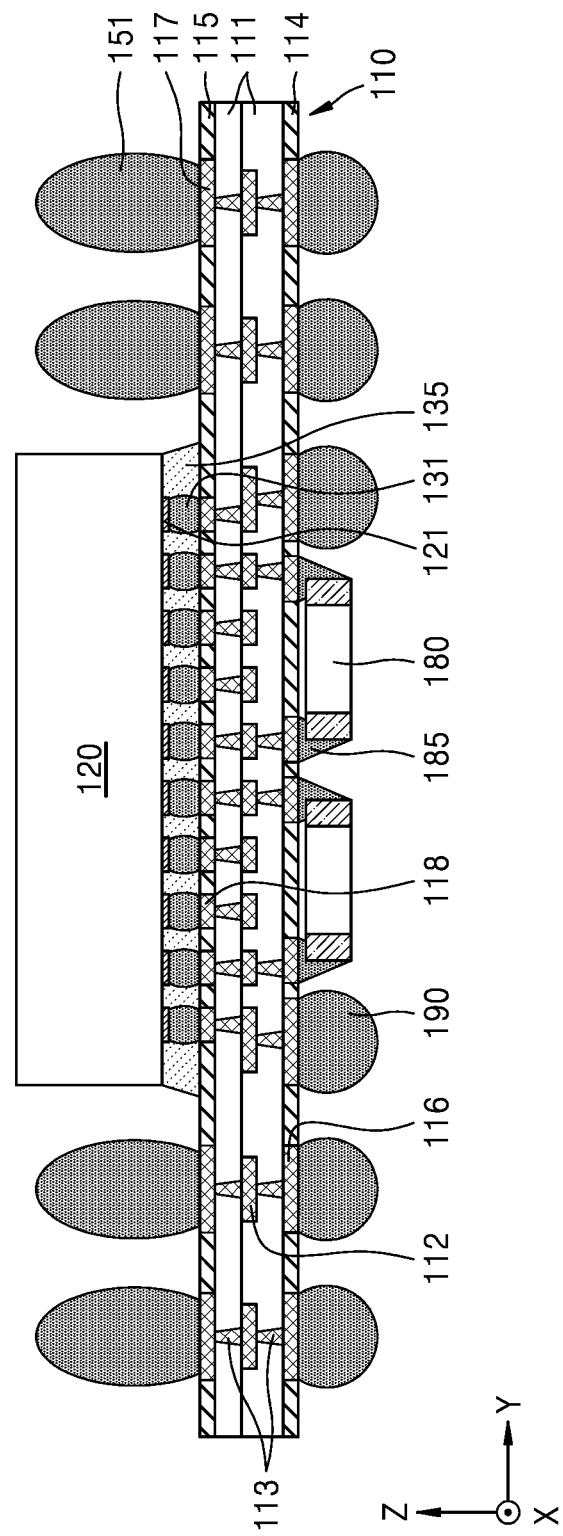
FIGS. 7 to 11 are cross-sectional views of a manufacturing method of a semiconductor package, according to example embodiments.
Figure 8:
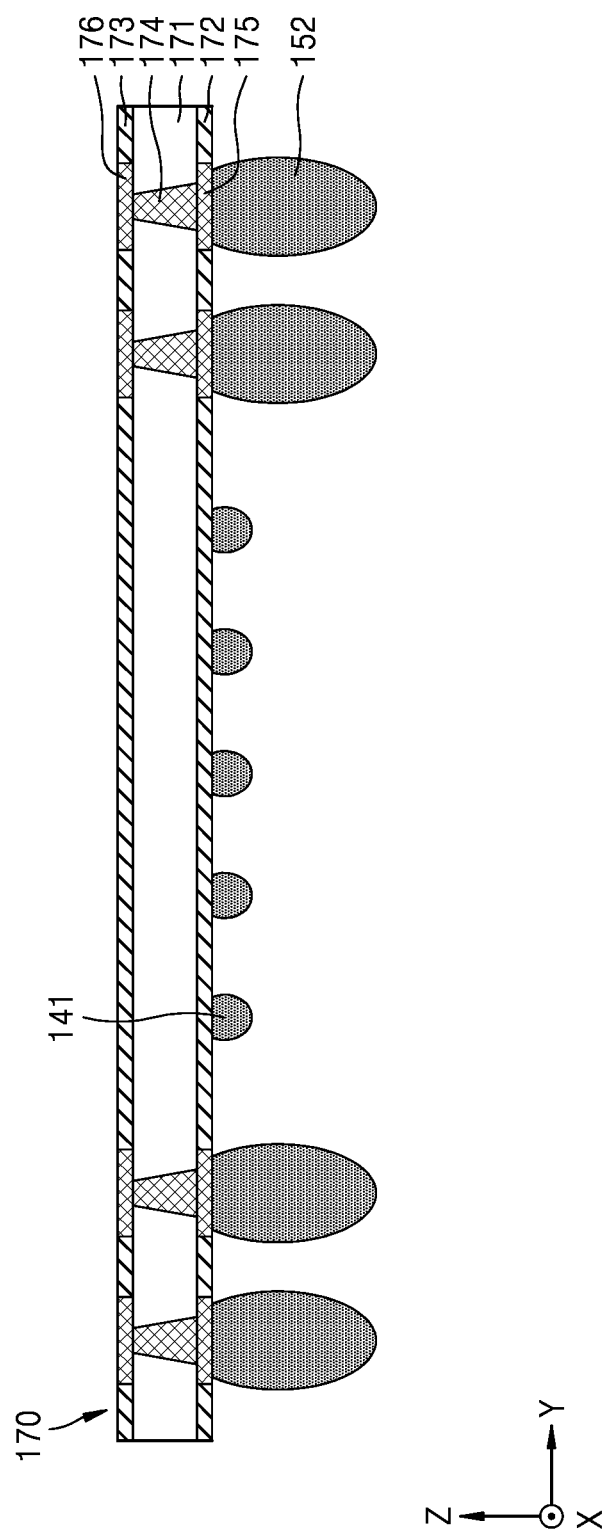

Referring to FIGS. 6 to 8, in P110, first conductive connectors 151 may be provided to the package substrate 110, and second conductive connectors 152 and cooling solders 141 may be provided to the interposer 170. For example, the first conductive connectors 151 may be provided on the first upper pads 117 of the package substrate 110, the second conductive connectors 152 may be provided on the lower pads 175 of the interposer 170, and the cooling solders 141 may be provided on the lower protective layer 172 of the interposer 170.

According to example embodiments, the first conductive connectors 151, the second conductive connectors 152, and the cooling solders 141 may include conductive materials. According to example embodiments, each of the first conductive connectors 151, the second conductive connectors 152, and the cooling solders 141 may include a solder material. According to example embodiments, the first conductive connectors 151, the second conductive connectors 152, and the cooling solders 141 may include Cu, Sn, Pb, or the like. According to example embodiments, each of the first conductive connectors 151, the second conductive connectors 152, and the cooling solders 141 may include an alloy material of at least some of Cu, Sn, and Pb.

A height (that is, a length in the Z direction) and a maximum horizontal width (that is, a length in the X or Y direction) of each cooling solder 141 may be several hundreds of μm. The height (that is, the length in the Z direction)

and the maximum horizontal width (that is, the length in the X or Y direction) of each cooling solder 141 may be about 50 µm.

Figure 9:
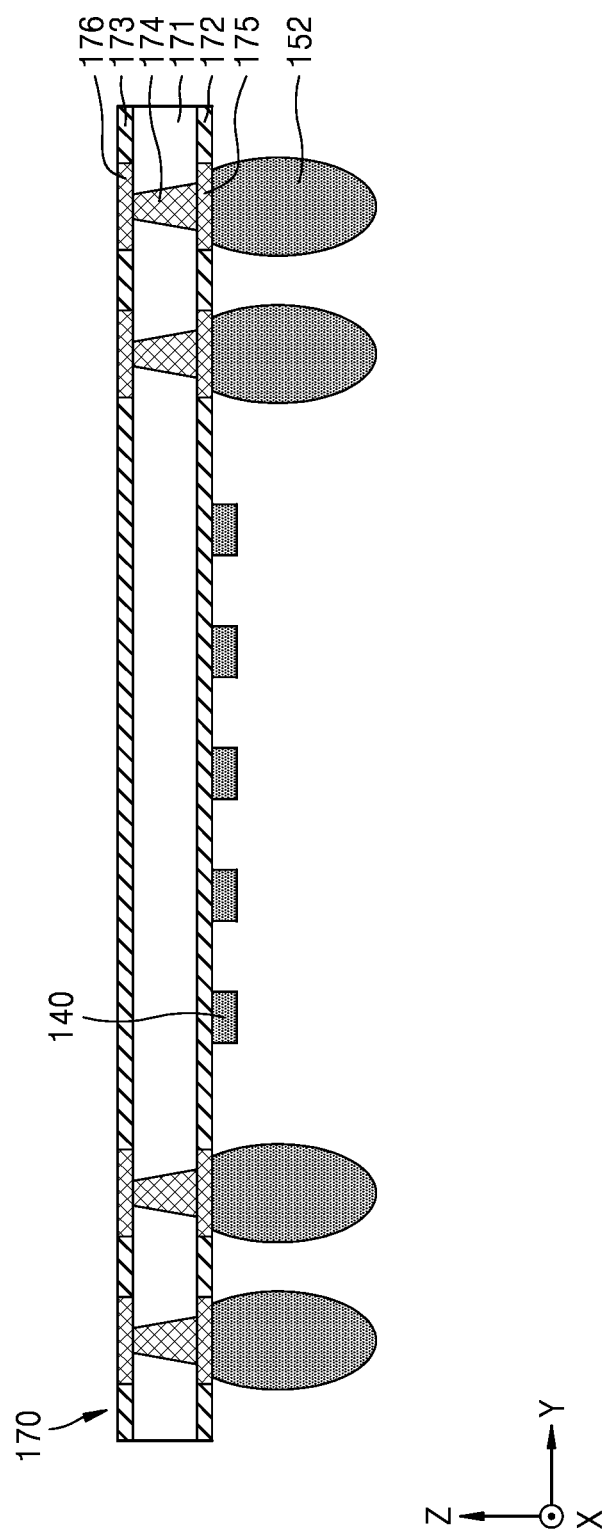

Referring to FIGS. 6, 8, and 9, in P120, the cooling patches 140 may be formed by molding the cooling solders 141. The cooling patches 140 may be formed through a coining process in which the cooling solders 141 are compressed. The cooling patches 140 may be formed through, for example, a thermal compression process.

Figure 10:
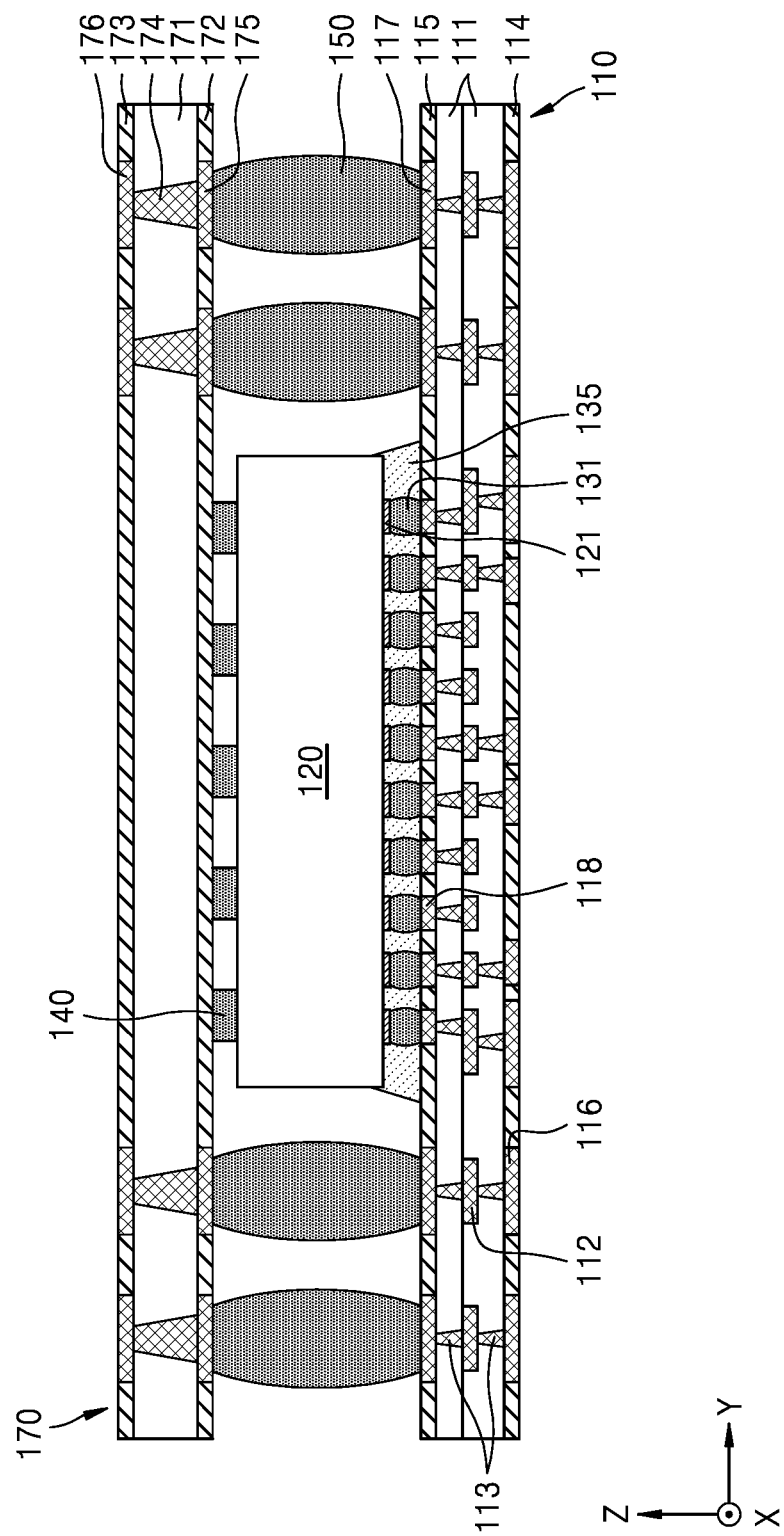

Referring to FIGS. 6 and 10, in P130, the interposer 170 may be coupled to the package substrate 110.

The coupling of the interposer 170 to the package substrate 110 may include forming the conductive connectors 150 by reflowing or thermally compressing the first and second conductive connectors 151 and 152.

After the interposer 170 is coupled to the package substrate 110, a flux cleaning process may be performed. The flux cleaning may be performed using a water-based pH-neutral cleaning agent or using an alkaline cleaning agent. The flux cleaning may include any one of a batch-type cleaning process, a bath-type cleaning process, and an ultrasonic precipitation cleaning process. According to example embodiments, a space sufficient enough for flux cleaning may be provided between the semiconductor chip 120 and the interposer 170 because of the cooling solders 141, and thus, damage to the lower protective layer 172 may be prevented.

Figure 11:
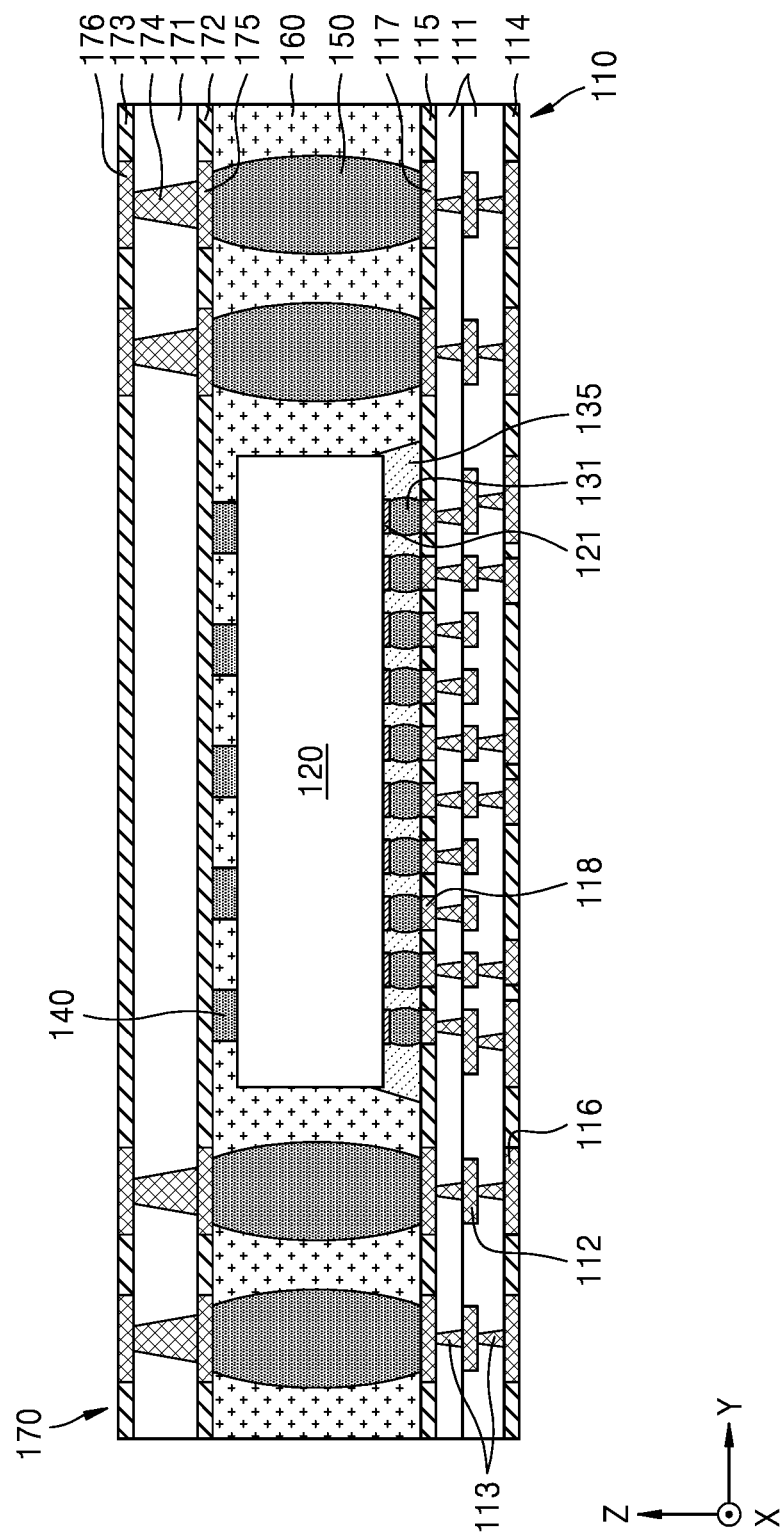

Referring to FIGS. 6 and 11, in P140, the insulation filler 160 covering the semiconductor chip 120, the cooling patches 140, and the conductive connectors 150 may be provided. Referring to FIG. 1, after the insulation filler 160 is provided, the external connection terminals 190 and the passive elements 180 may be further provided on the lower surface of the package substrate 110.

The manufacturing method of the semiconductor package 10 of FIG. 1 has been described so far. One of ordinary skill in the art could easily practice a manufacturing method of the semiconductor packages 11 to 14 described with reference to FIGS. 2A to 5 based on the descriptions herein.

Figure 12:
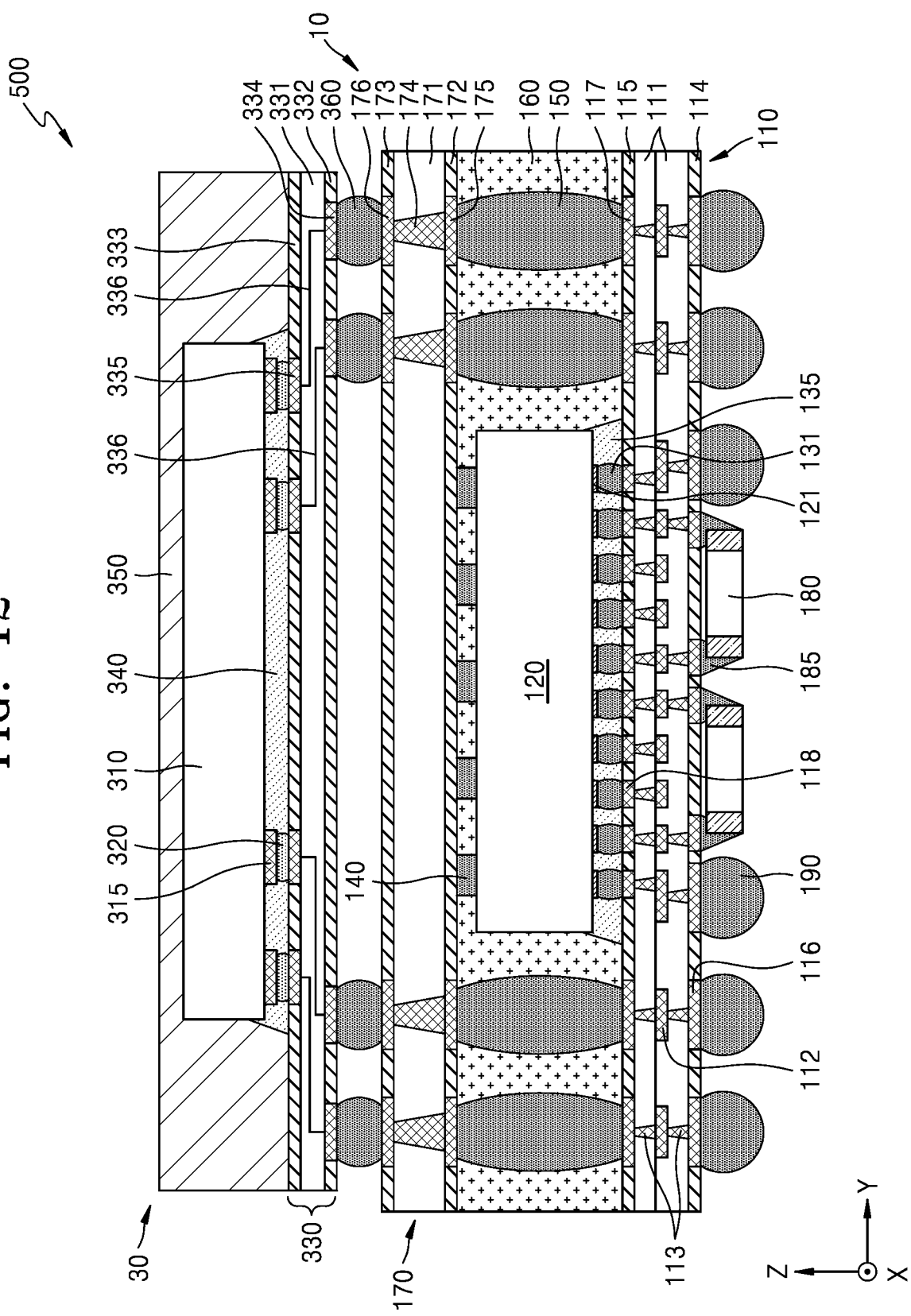
FIG. 12 is a cross-sectional view of a semiconductor package, according to example embodiments.

FIG. 12 is a cross-sectional view of a semiconductor package 500 according to example embodiments.

Referring to FIG. 12, the semiconductor package 500 may include the semiconductor package 10 and a semiconductor package 30. The semiconductor package 500 may be of a Package-on-Package type in which the semiconductor package 30 is stacked on the semiconductor package 10.

The semiconductor package 30 may include a semiconductor chip 310, a package substrate 330, and a molding layer 350.

The package substrate 330 may be, for example, a PCB. The package substrate 330 may include a substrate base 331 including at least one material selected from phenol resin, epoxy resin, and PI. Also, the package substrate 330 may include upper pads 335 arranged on an upper surface of the substrate base 331 and lower pads 334 arranged on a lower surface of the substrate base 331. In the substrate base 331, wirings 336 configured to be electrically connected to the upper and lower pads 335 and 334 may be formed. On the upper surface of the substrate base 331, an upper protective layer 333 covering the upper surface and exposing the upper pads 335 may be arranged. On the lower surface of the substrate base 331, a lower protective layer 332 covering the lower surface and exposing the lower pads 334 may be arranged.

The package substrate 330 may be mounted on the interposer 170. The package substrate 330 may be connected to the interposer 170 through connection terminals 360 arranged on the interposer 170. The connection terminals 360 may be respectively connected to the upper pads 176 of the interposer 170 and the lower pads 334 of the package substrate 330 and may electrically connect the upper pads 176 of the interposer 170 to the lower pads 334 of the package substrate 330. In example embodiments, the connection terminals 360 may contact bottom surfaces of the upper pads 176 of the interposer 170 and upper surfaces of the lower pads 334 of the package substrate 330.

The semiconductor chip 310 may be arranged on the package substrate 330. For example, chip pads 315 of the semiconductor chip 310 may be electrically connected to the upper pads 335 of the package substrate 330 through chip connection bumps 320. An underfill material layer 340 may be arranged between the semiconductor chip 310 and the package substrate 330, the underfill material layer 340 surrounding the chip connection bumps 320.

According to example embodiments, the semiconductor chip 120 may be of the same type as the semiconductor chip 310. According to example embodiments, the semiconductor chip 120 may be of a different type from the semiconductor chip 310. For example, when the semiconductor chip 120 is a logic chip, the semiconductor chip 310 may be a memory chip. According to example embodiments, the semiconductor chip 310 may be embodied as a High Bandwidth Memory (HBM) chip. According to example embodiments, the semiconductor package 500 may function as a system as different types of semiconductor chips and components such as passive elements are electrically connected to each other.

The molding layer 350 may be arranged on the package substrate 330 to cover at least a portion of the semiconductor chip 310. The molding layer 350 may include, for example, epoxy-group molding resin or PI-group molding resin. For example, the molding layer 350 may include an EMC.

The semiconductor package 500 including the semiconductor package 10 of FIG. 1 has been described so far, but one of ordinary skill in the art could easily practice examples including the semiconductor packages 11 to 14 of FIGS. 2A to 5 based on the descriptions herein.

Figure 13A:
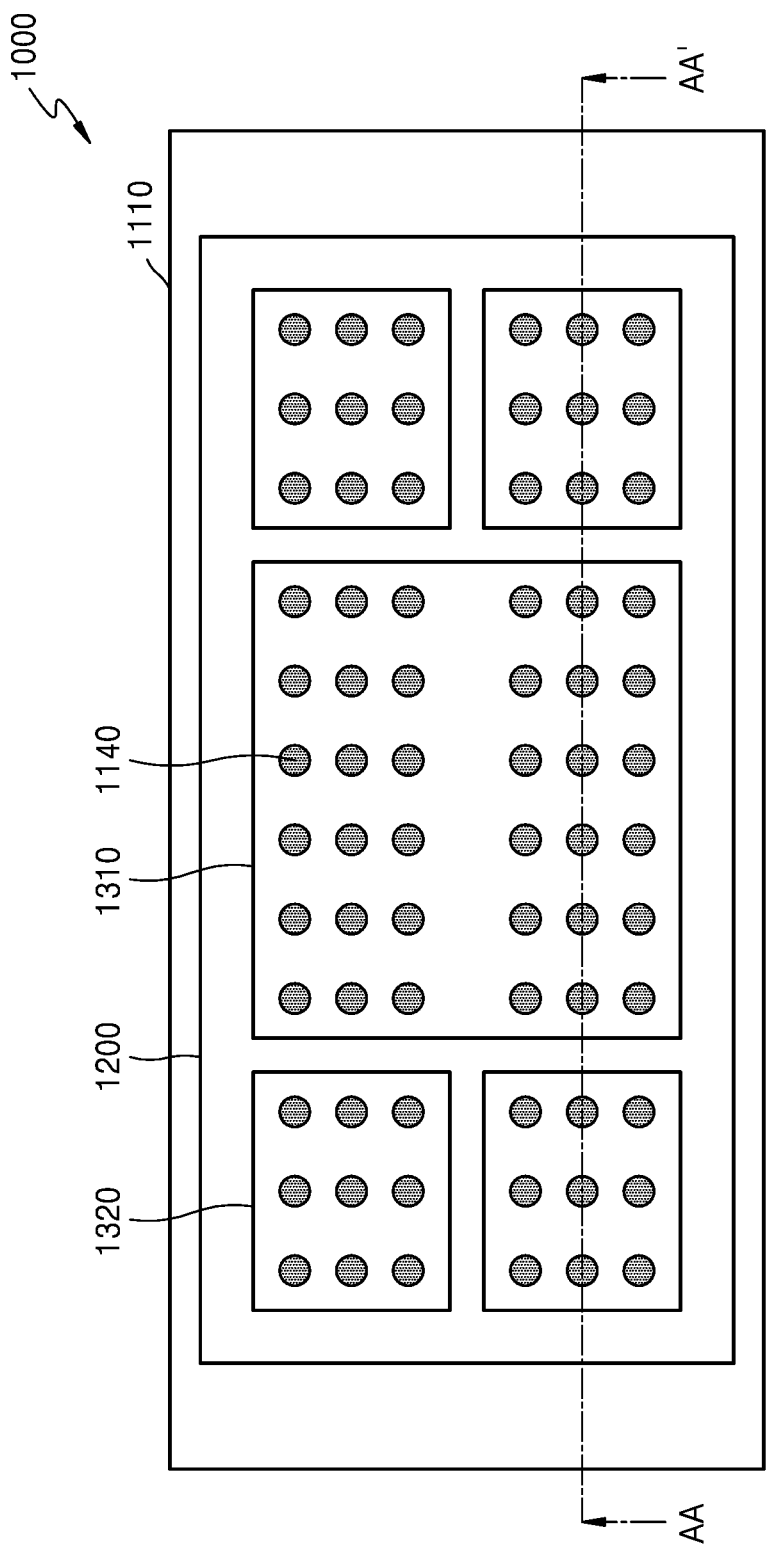
FIG. 13A is a plan view of a semiconductor package, according to other example embodiments.

FIG. 13A is a plan view of a semiconductor package 1000 according to other example embodiments.

Figure 13B:
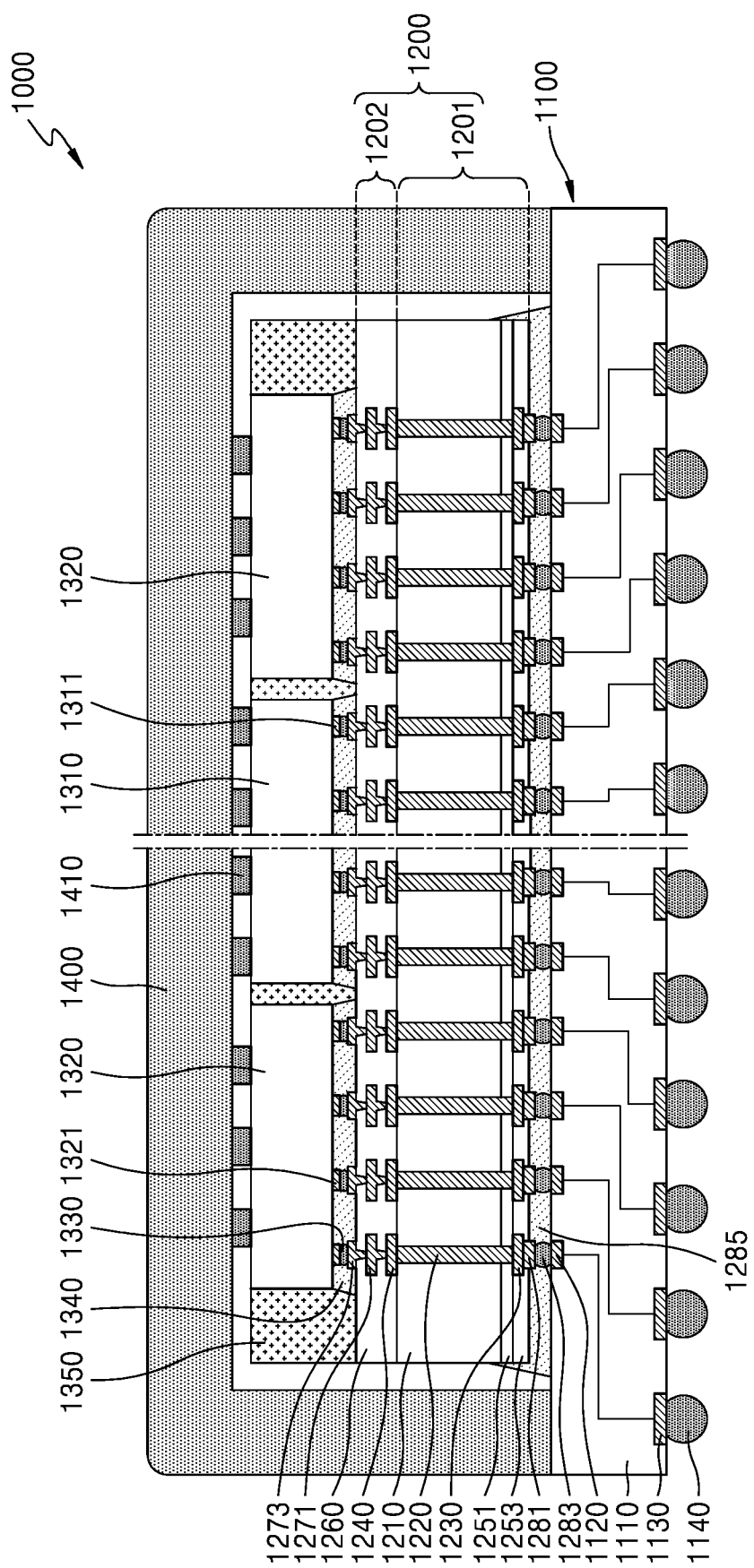
FIG. 13B is a cross-sectional view of a semiconductor package taken along line AA-AA' of FIG. 13A.

FIG. 13B is a cross-sectional view of the semiconductor package 1000 taken along line AA-AA' of FIG. 13A.

Referring to FIGS. 13A and 13B, the semiconductor package 1000 may include a package substrate 1100, an interposer 1200, a first semiconductor chip 1310, second semiconductor chips 1320, cooling patches 1410, and a heat dissipation device 1400.

The package substrate 1100 may include a substrate base 1110 and substrate upper pads 1120 and substrate lower pads 1130 that are respectively arranged on upper and lower surfaces of the substrate base 1110. According to example embodiments, the package substrate 1100 may be a PCB. For example, the package substrate 1100 may be a multi-layered PCB. The substrate base 1110 may include any one of phenol resin, epoxy resin, and PI. External connection terminals 1140 configured to electrically connect an external device to the semiconductor package 1000 may be connected to the substrate lower pads 1130.

Board-interposer connection bumps 1283 may be provided on the substrate upper pads 1120. Sizes of the board-interposer connection bumps 1283 may be greater than sizes of connection bumps 1330. The package substrate 1100 may be connected to the interposer 1200 through the board-interposer connection bumps 1283.

The interposer 1200 may include lower connection pillars 1281 arranged on lower conductive pads 1230. The lower connection pillars 1281 may be connected to the lower conductive pads 1230 through openings in a second lower protective layer 1253. The lower connection pillar 1281 may be Under Bump Metallurgy. The lower connection pillar 1281 may include Ni, Cu, Pd, platinum (Pt), gold (Au), or a combination thereof.

The package substrate 1100 may be electrically connected to the interposer 1200 through the board-interposer connection bumps 1283. The semiconductor package 1000 may include a first insulation filler 1285 arranged between the interposer 1200 and the package substrate 1100.

The first insulation filler 1285 may fill a gap between the interposer 1200 and the package substrate 1100 and cover the board-interposer connection bumps 1283. For example, the first insulation filler 1285 may include a base material layer such as epoxy resin and a filler included in the base material layer.

The interposer 1200 may include a TSV layer 1201 and a redistribution layer 1202. The TSV layer 1201 may include a base layer 1210, TSVs 1220, the lower conductive pads 1230, upper conductive pads 1240, a first lower protective layer 1251, and the second lower protective layer 1253. The base layer 1210 may include a semiconductor material, glass, ceramic, or plastic. According to example embodiments, the base layer 1210 may include a silicon wafer including crystalline silicon, polycrystalline silicon, or amorphous silicon. The base layer 1210 may be substantially planar.

The first lower protective layer 1251 may cover a lower surface of the base layer 1210. Also, the first lower protective layer 1251 may cover sidewalls of the TSVs 1220 protruding from the lower surface of the base layer 1210. According to example embodiments, the first lower protective layer 1251 may include an inorganic insulating material. For example, the first lower protective layer 1251 may include at least one of silicon oxide and silicon nitride.

The lower conductive pads 1230 may be arranged on a lower surface of the first lower protective layer 1251. For example, the lower conductive pads 1230 may be pads connected to the board-interposer connection bumps 1283, respectively. The lower conductive pad 1230 may include, for example, W, Al, Cu, or the like.

The second lower protective layer 1253 may cover the lower surface of the first lower protective layer 1251 and some portions of the lower conductive pads 1230. The second lower protective layer 1253 may include an opening through which some of the lower surfaces of the lower conductive pads 1230 are exposed. The board-interposer connection bumps 1283 may be connected to the lower conductive pads 1230 through the opening in the second lower protective layer 1253.

According to example embodiments, the second lower protective layer 1253 may include a different material from the first lower protective layer 1251. The first lower protective layer 1251 may include an inorganic insulating material, and the second lower protective layer 1253 may include an organic insulating material. According to example embodiments, the second lower protective layer 1253 may include a PID, PI, PBO, an inorganic insulating material, or the like.

The interposer 1200 may include the lower connection pillars 1281 arranged on the lower conductive pads 1230. The lower connection pillars 1281 may be connected to the lower conductive pads 1230 through the opening in the second lower protective layer 1253 and may contact a portion of the second lower protective layer 1253 that covers edge portions of the lower surfaces of the lower conductive pads 1230. The lower connection pillar 1281 may be Under Bump Metallurgy. The lower connection pillar 1281 may include Ni, Cu, Pd, Pt, Au, or a combination thereof. In some cases, the lower connection pillar 1281 may be omitted.

The TSVs 1220 may be configured to electrically connect the upper conductive pads 1240 to the lower conductive pads 1230. The TSVs 1220 may extend from the upper surface of the base layer 1210 to the lower surface thereof and may penetrate the base layer 1210 in a vertical direction. Also, the TSVs 1220 may further penetrate the first lower protective layer 1251. Upper ends of the TSVs 1220 may be connected to the upper conductive pads 1240, and lower ends of the TSVs 1220 may be connected to the lower conductive pads 1230.

The redistribution layer 1202 may be arranged on an upper surface of the TSV layer 1201. The redistribution layer 1202 may include redistribution patterns 1271 and 1273 electrically connected to the upper conductive pads 1240. The redistribution layer 1202 may further include an insulating layer 1260 covering the upper surface of the base layer 1210. The insulating layer 1260 may cover the upper conductive pads 1240 and the redistribution patterns 1271 and 1273. The redistribution layer 1202 may include a back-end-of-line (BEOL) structure.

According to example embodiments, the insulating layer 1260 may include an inorganic insulating material. For example, the insulating layer 1260 may include at least one of silicon oxide and silicon nitride. According to other example embodiments, the insulating layer 1260 may include an organic insulating material. For example, the insulating layer 1260 may include a PID such as PI.

The redistribution patterns 1271 may include line portions extending in a horizontal direction and via portions extending in a vertical direction. The redistribution patterns 1273 may include pad portions for electrical connection to the first and second semiconductor chips 1310 and 1320 and via portions for connection to the redistribution patterns 1271. The redistribution patterns 1271 and 1273 may include, for example, at least one metal selected from W, Al, and Cu.

The first and second semiconductor chips 1310 and 1320 may be mounted on the interposer 1200. The first and second semiconductor chips 1310 and 1320 may be spaced apart from each other, in the horizontal direction, on the redistribution layer 1202 of the interposer 1200. The first and second semiconductor chips 1310 and 1320 may be mounted on the interposer 1200 in a flip-chip manner. Chip pads 1311 and 1321 of the first and second semiconductor chips 1310 and 1320 may be electrically connected to the redistribution patterns 1273 through the connection bumps 1330. The chip pads 1311 and 1321 of the first and second semiconductor chips 1310 and 1320 may be used as terminals for input/output data signal transmission or terminals for power and/or ground connection.

For example, the first semiconductor chip 1310 arranged on the horizontal center of the semiconductor package 1000 may be a logic chip, and the second semiconductor chips 1320 arranged on edges of the first semiconductor chip 1310 may be memory chips. According to example embodiments, a first horizontal area of the first semiconductor chip 1310 may be greater than a second horizontal area that is a horizontal area of each second semiconductor chip 1320.

According to example embodiments, each second semiconductor chip 1320 may include a volatile memory chip and/or a non-volatile memory chip. Examples of the volatile memory chip may include DRAM, SRAM, TRAM, ZRAM, or TTRAM. Also, the non-volatile memory chip may include, for example, flash memory, MRAM, STT-MRAM, FRAM, PRAM, RRAM, nanotube RRAM, polymer RAM, insulator resistance change memory, or the like.

As another example, each of the second semiconductor chips 1320 may include a stack-type semiconductor memory chip. The stack-type semiconductor chip may be realized based on HBM or Hybrid Memory Cube (HMC) standards.

The first semiconductor chip 1310 may execute applications supported by the semiconductor package 1000 by using the second semiconductor chips 1320. For example, the first semiconductor chip 1310 may execute specialized operations by including at least one of a Central Processing Unit (CPU), an AP, a Graphics Processing Unit (GPU), a Neural Processing Unit (NPU), a Tensor Processing Unit (TPU), a Vision Processing Unit (VPU), an Image Signal Processor (ISP), and a Digital Signal Processor (DSP).

The semiconductor package 1000 may include a second insulation filler 1340 arranged between the first and second semiconductor chips 1310 and 1320 and the interposer 1200. The second insulation filler 1340 may cover the redistribution patterns 1273, the connection bumps 1330, and the chip pads 1311 and 1321.

The semiconductor package 1000 may further include a third insulation filler 1350 covering a side surface of each of the first and second semiconductor chips 1310 and 1320. The third insulation filler 1350 may include a base material layer such as epoxy resin and a filler included in the base material layer.

The cooling patches 1410 may be arranged on the first and second semiconductor chips 1310 and 1320. According to example embodiments, the cooling patches 1410 may be adjacent to hot spots of each of the first and second semiconductor chips 1310 and 1320. Because the cooling patches 1410 are similar to the cooling patches 140 described with reference to FIG. 1, the repeated descriptions thereof are not provided.

The semiconductor package 1000 may further include the heat dissipation device 1400 covering upper surfaces of the first and second semiconductor chips 1310 and 1320. The heat dissipation device 1400 may include a heat dissipation plate such as a heat slug or a heat sink. According to example embodiments, the heat dissipation device 1400 may be attached to the upper surface of the package substrate 1100 and may surround the side surface of the interposer 1200 and the side surfaces of the first and second semiconductor chips 1310 and 1320.

An existing semiconductor package may be arranged between the first and second semiconductor chips 1310 and 1320 and the heat dissipation device 1400 and may include a Thermal Interface Material (TIM) layer having thermal conductivity ranging from about 3 W/m·K to about 4 W/m·K. Accordingly, the cooling of the first and second semiconductor chips 1310 and 1320 by the heat dissipation device 1400 may be insufficient. According to example embodiments, as the cooling patches 1410 having high thermal conductivity is provided between the first and second semiconductor chips 1310 and 1320 and the heat dissipation device 1400, the cooling efficiency of the semiconductor package 1000 may be improved.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a package substrate;
   an interposer arranged on the package substrate and comprising a plurality of lower pads and a lower protective layer that comprises a plurality of openings exposing the plurality of lower pads;
   a plurality of conductive connectors connecting the package substrate to the interposer;
   a semiconductor chip arranged between the package substrate and the interposer;
   a plurality of cooling patches arranged between the semiconductor chip and the interposer and having cylindrical shapes; and
   an insulation filler directly contacting side surfaces of the plurality of conductive connectors, a side surface of the semiconductor chip, and side surfaces of the plurality of cooling patches,
   wherein upper surfaces of the plurality of cooling patches are coplanar with an upper surface of the insulation filler,
   wherein lower surfaces of the plurality of cooling patches directly contact an upper surface of the semiconductor chip,
   wherein a height of each of the plurality of cooling patches is less than or equal to a diameter of each of the plurality of cooling patches,
   wherein thermal conductivity of each of the plurality of cooling patches is greater than thermal conductivity of the lower protective layer,
   wherein the thermal conductivity of each of the plurality of cooling patches ranges from 10 W/(m·K) to 100 W/(m·K),
   wherein the diameter of each of the plurality of cooling patches ranges from 50 μm to 200 μm, and
   wherein the height of each of the plurality of cooling patches ranges from 10 μm to 100 μm.

2. The semiconductor package of claim 1, wherein each of the plurality of cooling patches comprises a conductive material.

3. The semiconductor package of claim 1, wherein each of the plurality of cooling patches comprises a solder material.

4. The semiconductor package of claim 1, wherein each of the plurality of cooling patches comprises any one of copper, tin, and lead.

5. The semiconductor package of claim 1, wherein each of the plurality of cooling patches directly contacts a lower surface of the interposer.

6. The semiconductor package of claim 1,
   wherein the semiconductor chip comprises a plurality of hot spots that are local maximum points of a temperature of the semiconductor chip during operation, and
   wherein some of the plurality of cooling patches vertically overlap corresponding ones of the plurality of hot spots.

7. The semiconductor package of claim 1, wherein the insulation filler surrounds a side surface of each of the plurality of cooling patches.

8. The semiconductor package of claim 1, further comprising a heat dissipation device arranged on the interposer.

9. The semiconductor package of claim 8, wherein the interposer comprises a plurality of lower thermal conductive pads respectively connected to the plurality of cooling patches, and a plurality of upper thermal conductive pads connected to the heat dissipation device.

10. The semiconductor package of claim 9, wherein the plurality of lower thermal conductive pads and the plurality of upper thermal conductive pads are insulated from the semiconductor chip and the package substrate.

11. The semiconductor package of claim 9, further comprising a plurality of thermally conductive vias connecting the plurality of upper thermal conductive pads to the plurality of lower thermal conductive pads.

12. A semiconductor package comprising:
a package substrate;
an interposer arranged on the package substrate and comprising a base insulating layer and a plurality of Through Silicon Vias (TSVs) penetrating the base insulating layer;
a plurality of conductive connectors connecting the package substrate to the interposer;
a semiconductor chip arranged between the package substrate and the interposer and comprising a plurality of hot spots that are local maximum points of a temperature of the semiconductor chip during operation; and
a plurality of cooling patches arranged between the semiconductor chip and the interposer and adjacent to the plurality of hot spots, each of the plurality of cooling patches having a cylindrical shape,
wherein lower surfaces of the plurality of cooling patches directly contact an upper surface of the semiconductor chip,
wherein upper surfaces of the plurality of cooling patches are at the same level as upper surfaces of the plurality of conductive connectors, wherein a height of each of the plurality of cooling patches is less than or equal to a diameter of each of the plurality of cooling patches,
wherein thermal conductivity of each of the plurality of cooling patches ranges from 10 W/(m·K) to 100 W/(m·K),
wherein the diameter of each of the plurality of cooling patches ranges from 50 μm to 200 μm, and
wherein the height of each of the plurality of cooling patches ranges from 10 μm to 100 μm.

13. The semiconductor package of claim 12, further comprising:
a plurality of insulating patches arranged between the semiconductor chip and the interposer,
wherein the height of each of the plurality of cooling patches is the same as a height of each of the plurality of insulating patches.

14. The semiconductor package of claim 13,
wherein the plurality of insulating patches are spaced apart from the plurality of hot spots, respectively.

15. The semiconductor package of claim 13, wherein the thermal conductivity of each of the plurality of cooling patches is greater than thermal conductivity of each of the plurality of insulating patches.

16. The semiconductor package of claim 13, wherein a planar shape of each of the plurality of cooling patches is different from a planar shape of each of the plurality of insulating patches.

17. A semiconductor package comprising:
a package substrate;
an interposer arranged on the package substrate and comprising a plurality of lower pads and a lower protective layer that comprises a plurality of openings exposing the plurality of lower pads;
a plurality of conductive connectors connecting the package substrate to the interposer;
a semiconductor chip arranged between the package substrate and the interposer;
a plurality of cooling patches having cylindrical shapes, each of the plurality of cooling patches having lower surfaces directly contacting an upper surface of the semiconductor chip and upper surfaces contacting a lower surface of the interposer; and
an insulation filler surrounding the plurality of cooling patches and directly contacting side surfaces of the plurality of cooling patches,
wherein an upper surface of the insulation filler is coplanar with upper surfaces of the plurality of conductive connectors and upper surfaces of the plurality of cooling patches,
wherein a height of each of the plurality of cooling patches is less than or equal to a diameter of each of the plurality of cooling patches,
wherein thermal conductivity of each of the plurality of cooling patches is greater than thermal conductivity of the lower protective layer,
wherein the diameter of each of the plurality of cooling patches ranges from 50 μm to 200 μm, and
wherein the height of each of the plurality of cooling patches ranges from 10 μm to 100 μm.

\* \* \* \* \*